(12) United States Patent
Sone et al.

(10) Patent No.: US 8,956,969 B2
(45) Date of Patent: Feb. 17, 2015

(54) HOLE FORMATION METHOD, MULTILAYER WIRING, SEMICONDUCTOR DEVICE, DISPLAY ELEMENT, IMAGE DISPLAY DEVICE, AND SYSTEM CONTAINING VIA HOLE FORMED BY THE HOLE FORMATION METHOD

(75) Inventors: Yuji Sone, Kanagawa (JP); Naoyuki Ueda, Kanagawa (JP); Yuki Nakamura, Tokyo (JP); Yukiko Abe, Kanagawa (JP); Kazuhiro Murata, Ibaraki (JP); Kazuyuki Masuda, Ibaraki (JP)

(73) Assignees: Ricoh Company, Ltd., Tokyo (JP); Sijtechnology, Inc., Ibaraki (JP)

( * ) Notice: Subject to any disclaimer, the term of this patent is extended or adjusted under 35 U.S.C. 154(b) by 250 days.

(21) Appl. No.: 13/372,874

(22) Filed: Feb. 14, 2012

(65) Prior Publication Data
US 2012/0206068 A1     Aug. 16, 2012

(30) Foreign Application Priority Data

Feb. 16, 2011   (JP) .................................. 2011-030992
Feb. 10, 2012   (JP) .................................. 2012-026934

(51) Int. Cl.
| | | |
|---|---|---|
| *H01L 21/4763* | (2006.01) | |
| *H01L 21/768* | (2006.01) | |
| *H05K 3/46* | (2006.01) | |

(52) U.S. Cl.
CPC ........ *H01L 21/76802* (2013.01); *H05K 3/4644* (2013.01); *H05K 2203/308* (2013.01)

USPC ..... 438/637; 438/640; 438/701; 257/E21.578

(58) Field of Classification Search
CPC .................... H01L 21/76802; H01L 21/76804
USPC ................. 438/622, 637–640, 672, 675, 701; 257/E21.578
See application file for complete search history.

(56) References Cited

U.S. PATENT DOCUMENTS

2009/0004841 A1 *  1/2009  Supriya et al. ................ 438/618

FOREIGN PATENT DOCUMENTS

| JP | 3028279 | 2/2000 |
|---|---|---|
| JP | 2003-518755 | 6/2003 |
| JP | 2005-500558 | 1/2005 |
| JP | 2005-50558 | 2/2005 |
| JP | 2007-95783 | 4/2007 |
| JP | 2009-21552 | 1/2009 |
| WO | WO01/47044 A2 | 6/2001 |
| WO | WO02/095805 A2 | 11/2002 |

* cited by examiner

*Primary Examiner* — Thanhha Pham
(74) *Attorney, Agent, or Firm* — Cooper & Dunham LLP

(57) ABSTRACT

A hole formation method including applying a pillar-forming liquid to a base material, to thereby form a pillar; applying an insulating film-forming material to the base material on which the pillar has been formed, to thereby form an insulating film; removing the pillar to form an opening in the insulating film; and heat treating the insulating film in which the opening has been formed.

9 Claims, 30 Drawing Sheets

74

HOLE FORMATION METHOD, MULTILAYER WIRING, SEMICONDUCTOR DEVICE, DISPLAY ELEMENT, IMAGE DISPLAY DEVICE, AND SYSTEM CONTAINING VIA HOLE FORMED BY THE HOLE FORMATION METHOD

BACKGROUND OF THE INVENTION

1. Field of the Invention

The present invention relates to a hole formation method, a multilayer wiring, a semiconductor device, a display element, an image display device, a system each containing a via hole formed by the hole formation method.

2. Description of the Related Art

In recent years, more and more integration and densification have been conducted on devices such as LSI (Large Scale Integrated Circuit) used in, for example, integrated circuits, and AM-TFT (Active Matrix Thin Film Transistor) used in, for example, displays.

One typical production process of the devices is photolithography. With the photolithography using an aligner, it is possible to easily form a fine pattern of 1 μm to 10 μm. With the photolithography using a stepper, it is possible to easily form a fine pattern of 1 μm or less.

However, the photolithography requires expensive devices, a large number of steps, and time and effort to treat waste liquids, which is problematic.

Meanwhile, as a simple process other than such photolithography, a fine pattern formation technology at low cost has attracted attention. Among these, printing methods such as an inkjet method and a screen printing method are expected as fine pattern formation techniques which have a small number of steps, exhibit high use efficiency of materials, can be performed with inexpensive devices and at low cost, and give less environmental loads.

In particular, techniques of fabricating AM-TFTs using printing methods have rapidly advanced, and the following techniques have reported, for example: a technique of fabricating an organic TFT of 76 ppi using a printing method (reverse printing) (see "T. Okubo, et al.: IDW '07, (2007), pp. 463-464."), a technique of fabricating an organic TFT of 200 ppi using a micro-contact printing method (see "K. Yase, et al.: IDW '09, (2009), pp. 717-720."), and a technique of fabricating an organic TFT of 200 ppi by combining an inkjet method with surface energy control by UV irradiation (see "K. Suzuki, et al.: IDW '09, (2009), pp. 1581-1584.").

As one technique of forming a hole (via hole) using the above printing method, there has been proposed a hole formation technique in which a solvent capable of dissolving an insulating film is locally dropped on the insulating film using an inkjet method (see Japanese Patent Application Laid-Open (JP-A) No. 2003-518755).

However, in the above technique, the insulating film dissolved by the solvent problematically remains as residues. Furthermore, in order to form a fine hole, it is necessary to adjust the amount of each liquid droplet ejected by the inkjet method to several tens pico liters or less. The evaporation rate at ambient temperature greatly affects the formation of the liquid droplets, and thus the hole formation process is decreased in reproducibility, leading to a drop in yield.

Also, there has been proposed a hole formation technique in which liquid droplets of a liquid repellent material are applied by an inkjet method to a region where a hole is to be formed to thereby form a liquid repellent region, and a solution of an insulating film material is applied to the other region than the liquid repellent region (see JP-A No. 2009-21552).

However, in the above technique, it is necessary to apply the solution of an insulating film material to the other region than the liquid repellent region by the inkjet method, leading to a drop in throughput and uniformity of film thickness.

Moreover, there has been proposed a hole formation technique in which a hole (contact hole) of about 20 μm to about 45 μm is formed by screen printing where printing is performed in line pattern, and then printing is performed in dot pattern (discontinuous pattern) on the line pattern (see JP-A No. 2007-95783).

However, in the above technique, it is difficult to control liquid running, resulting in large variation in diameter of holes and hence being lack of reproducibility of the hole formation process.

In addition to the above-described problems, the hole formation by the printing method generally forms an interlayer insulating film having a thickness on the order of micrometers. As a result, the aspect ratio of the resultant film becomes high to make it difficult to form a fine pattern.

As described above, the hole formation method by the printing method has not yet established a process exhibiting satisfactory resolution and reproducibility.

A laser drill method has been proposed as a hole formation technique other than the photolithography and the printing method. With this laser drill method, laser light such as $CO_2$ laser or YAG laser can be used to form a hole (opening) having a maximum diameter of about 20 μm in multilayer wirings such as printed wiring board.

For example, there has been proposed a technique of forming a fine pattern by applying laser to abrade or evaporate the laser-applied region, or by applying laser and removing the applied region through development (see JP-A No. 2005-50558).

However, the above technique poses a problem that a laser device is expensive. In addition, this technique poses another problem that when the laser-applied region is abraded or evaporated, its process margin is small which can form a hole only in the interlayer insulating film while keeping the shape of the lower electrode in a thin film such as AM-TFT.

In view of the above, demand has arisen for easy formation of a fine hole (for example, a via hole) with high reproducibility, high efficiency and low cost.

SUMMARY OF THE INVENTION

The present invention aims to solve the above-described existing problems and achieve the following objects. Specifically, an object of the present invention is to provide: a hole formation method having high process reproducibility and capable of efficiently forming a fine hole at low cost; and a multilayer wiring, a semiconductor device, a display element, an image display device, and a system each containing a via hole formed by the hole formation method.

Means for solving the above existing problems are as follows.

A hole formation method of the present invention includes:
applying a pillar-forming liquid to a base material, to thereby form a pillar;
applying an insulating film-forming material to the base material on which the pillar has been formed, to thereby form an insulating film;
removing the pillar to form an opening in the insulating film; and heat treating the insulating film in which the opening has been formed.

The present invention can provide: a hole formation method having high process reproducibility and capable of efficiently forming a fine hole at low cost; and a multilayer wiring, a semiconductor device, a display element, an image display device, and a system each containing a via hole formed by the hole formation method. These can solve the above existing problems and achieve the above objects.

BRIEF DESCRIPTION OF THE DRAWINGS

FIG. 23A-2 illustrates one exemplary step of forming a pillar (part 1-2).

FIG. 23B-1 illustrates one exemplary step of forming a pillar (part 2-1).

FIG. 23B-2 illustrates one exemplary step of forming a pillar (part 2-2).

FIG. 23C-1 illustrates one exemplary step of forming a pillar (part 3-1).

FIG. 23C-2 illustrates one exemplary step of forming a pillar (part 3-2).

FIG. 23C-3 illustrates one exemplary step of forming a pillar (part 3-3).

Figure 1A:
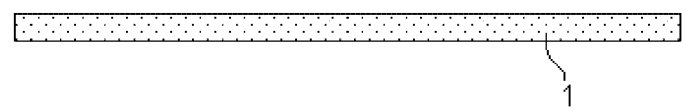
FIG. 1A illustrates one exemplary method of the present invention for producing a multilayer wiring (part 1).

DETAILED DESCRIPTION OF THE INVENTION (Hole Formation Method)

A hole formation method of the present invention is a production process for producing an electronic circuit on a base material, and includes at least a pillar formation step, an insulating film formation step, a pillar removal step and a heat treatment step; and, if necessary, further includes other steps.

<Pillar Formation Step>

The pillar formation step is a step of applying a pillar forming liquid onto the base material to form a pillar.

<<Base Material>>

The shape, structure and size of the base material are not particularly limited and may be appropriately selected depending on the intended purpose.

The material of the base material is not particularly limited and may be appropriately selected depending on the intended purpose. The base material is, for example, a glass base material or a plastic base material.

The glass base material is not particularly limited and may be appropriately selected depending on the intended purpose. It is, for example, an alkali-free glass or a silica glass.

The plastic base material is not particularly limited and may be appropriately selected depending on the intended purpose. The plastic base material is made of, for example, polycarbonate (PC), polyimide (PI), polyethylene terephthalate (PET) or polyethylene naphthalate (PEN).

Notably, the base material is preferably subjected to a known washing pretreatment using an oxygen plasma, UV ozone or UV irradiation from the viewpoints of cleaning a surface of the base material and improving adhesiveness of the surface of the base material.

<<Pillar>>

In the present invention, the pillar refers to a structure three-dimensionally grown in the height direction (vertical direction) rather than a structure grown two-dimensionally. The shape, structure and size of the pillar are not particularly limited and may be appropriately selected depending on the intended purpose. Examples of the shape of the pillar include a conical shape, a cylindrical shape and a rectangular cylindrical shape.

The maximum height of the pillar is not particularly limited and may be appropriately selected depending on the intended purpose, but is preferably greater than an average thickness of the insulating film to be formed in the below-described pillar removal step. Also, the maximum height of the pillar is preferably 5 or more times the average thickness of the insulating film. For example, it is preferably 0.5 μm to 50 μm, more preferably 1 μm to 30 μm, particularly preferably 2 μm to 10 μm.

The maximum height of the pillar is the maximum value obtained by measuring the three-dimensional shape of the pillar using an atomic force microscope (AFM).

<<Pillar-Forming Liquid (First Embodiment)>>

The pillar-forming liquid according to a first embodiment contains a resin and a solvent; and, if necessary, further contains other ingredients. The pillar-forming liquid of the first embodiment is preferably an electrically conductive solution or high-permittivity solution. Specifically, the pillar-forming liquid of the first embodiment preferably has an electrical conductivity of $10 \times 10^{-5}$ S/m or more or a permittivity of 5 or more.

—Resin—

The resin is not particularly limited and may be appropriately selected depending on the intended purpose. Examples of the resin include thermosetting resins, UV-curable resins and thermoplastic resins. In the case where the thermosetting resin or UV-curable resin is used, when the curing treatment is performed after the formation of the pillar, there are failures in the below-described pillar removal step. Thus, the next step is preferably performed without performing the curing step.

Examples of the resin include epoxy resins, acrylic resins, phenolic resins, polyimide resins, polyamide resins, polyester resins, polyvinyl phenolic resins, polyvinyl alcohol resins, polyvinyl acetate resins, polysulfone resins, fluororesins, copolymer resins or polymer alloys thereof, and prepolymers thereof. These may be used alone or in combination. Among these, thermoplastic acrylic resins and thermosetting polyimide resins are particularly preferable.

The amount of the resin contained in the pillar-forming liquid according to the first embodiment is not particularly limited and may be appropriately selected depending on the intended purpose, but it is preferably from 5% by mass to 50% by mass.

—Solvent—

The solvent is not particularly limited and may be appropriately selected depending on the intended purpose, but is preferably a polar solvent having a high permittivity. Specifically, the permittivity of the polar solvent is preferably 5 or more, more preferably 10 or more.

Examples of the high-permittivity polar solvents include polar solvents such as methanol, ethanol, isopropyl alcohol, n-butanol, n-hexanol, n-octanol, ethylene glycol, diethylene glycol, propylene glycol, 1,3-butylene glycol, benzyl alcohol, 2-methoxyethanol, 2-ethoxyethanol, 2-butoxyethanol, dipropyleneglycolmonomethylether, acetone, methyl ethyl ketone, methyl isobutyl ketone, methyl n-butyl ketone, methyl n-amyl ketone, acetophenone, cyclohexane, γ-butyrolactone, propylene carbonate, formamide, N,N-dimethylformamide, N,N-dimethylacetoamide, 1,3-dimethyl-2-imidazolidinone, N,N'-dimethylpropyleneurea, 2-pyrrolidinone, N-methylpyrrolidone, nitromethane, nitrobenzene, and methylsulfoxide. These may be used alone or in combination.

—Other Ingredients—

The other ingredients are not particularly limited and may be appropriately selected depending on the intended purpose. Examples of the other ingredients include dispersing agents, stabilizing agents, and curing agents.

The pillar-forming liquid is not particularly limited and may be appropriately prepared or commercially available. Examples of the commercially available pillar-forming liquid include a solution of a thermoplastic acrylic resin (product name: KH-CT-865, product of Hitachi Chemical Co., Ltd.) diluted with γ-butyrolactone, a solution of a thermosetting polyimide resin in γ-butyrolactone (product name: HPC-5030, product of Hitachi Chemical Co., Ltd.), and a solution of a thermosetting polyimide diluted with γ-butyrolactone (product name: YUPICOAT FS-100L, product of Ube Kosan Co., Ltd.).

<<Pillar-Forming Liquid (Second Embodiment)>>

The pillar-forming liquid according to a second embodiment contains inorganic nanoparticles and a solvent; and, if necessary, further contains other ingredients. The pillar-forming liquid of the second embodiment is preferably an electrically conductive solution or high-permittivity solution. Specifically, the pillar-forming liquid of the second embodiment preferably has an electrical conductivity of $10 \times 10^{-5}$ S/m or more or a permittivity of 5 or more.

—Inorganic Nanoparticles—

Examples of the inorganic nanoparticles include metal nanoparticles such as silver (Ag) nanoparticles, gold (Au) nanoparticles, and copper (Cu) nanoparticles, and oxide nanoparticles such as ITO (Indium-Tin Oxide) nanoparticles, tin oxide nanoparticles, and antimony oxide-doped tine oxide nanoparticles. Among them, silver nanoparticles and gold nanoparticles are particularly preferable.

The average particle diameter of the inorganic nanoparticles is not particularly limited and may be appropriately selected depending on the intended purpose, but is preferably 5 nm to 50 nm.

The inorganic nanoparticles are not particularly limited and may be appropriately prepared or commercially available. Examples of the commercially available inorganic nanoparticles include silver nanoparticles (product name: NPS-J, product of Harima Chemicals, Inc., average particle diameter: 12 nm) and gold nanoparticles (product name: NPG-J, product of Harima Chemicals, Inc., average particle diameter: 7 nm).

The amount of the inorganic nanoparticles contained in the pillar-forming liquid according to the second embodiment is not particularly limited and may be appropriately selected depending on the intended purpose, but is preferably 10% by mass to 70% by mass.

—Solvent—

The solvent is not particularly limited and may be appropriately selected depending on the intended purpose. Examples of the solvent include polar solvents, nonpolar solvents, and fluorine-containing solvents. The polar solvents, the nonpolar solvents, and the fluorine-containing solvents used may be the same as those described below in relation to the insulating film-forming material.

—Other Ingredients—

The other ingredients are not particularly limited and may be appropriately selected depending on the intended purpose. Examples of the other ingredients include dispersing agents, and stabilizing agents.

<Insulating Film Formation Step>

The insulating film formation step is a step of forming an insulating film on the base material on which the pillar has been formed.

In the insulating film formation step, preferably, the insulating film is formed by applying an insulating film-forming material to the base material while keeping the shape of the pillar.

<<Insulating Film-Forming Material>>

The insulating film-forming material contains an organic insulating material, an inorganic oxide insulating material or an organic-inorganic hybrid material, and a solvent; and, if necessary, further contains other ingredients.

—Organic Insulating Material—

The organic insulating material is not particularly limited and may be appropriately selected depending on the intended purpose. Examples of the organic insulating material include resins such as thermosetting resins, UV-curable resins and thermoplastic resins.

Examples of the resin include epoxy resins, acrylic resins, phenolic resins, polyimide resins, polyamide resins, polyester resins, polyvinyl phenolic resins, polyvinyl alcohol resins, polyvinyl acetate resins, polysulfone resins, fluororesins, silicone resins, copolymer resins or polymer alloys thereof, and prepolymer thereof. These may be used alone or in combination. Among these, thermoplastic fluororesins, thermosetting polyimide resins, thermosetting acrylic resins, thermosetting epoxy resins, thermosetting phenolic resins, and thermosetting silicone resins are particularly preferable.

—Inorganic Oxide Insulating Material—

The inorganic oxide insulating material is not particularly limited and may be appropriately selected depending on the intended purpose. Examples of the inorganic oxide insulating material include $SiO_2$ and $Al_2O_3$ prepared from, for example, metal alkoxides or organic metal complexes. These may be used alone or in combination.

The inorganic oxide insulating material is not particularly limited and may be appropriately prepared or commercially available. Examples of the commercially available inorganic oxide insulating material include a spin-on-glass material in methyl isobutyl ketone serving as a solvent (product name: FOX (R)-16, product of Dow Corning Toray Co., Ltd.).

—Organic-Inorganic Hybrid Material—

The organic-inorganic hybrid material is not particularly limited and may be appropriately selected depending on the intended purpose. The organic-inorganic hybrid material refers to a material in which an organic component and an inorganic component are mixed together at the nano level. Examples thereof include: (1) a material where alkoxysilane is mixed with, for example, an acrylic resin or epoxy resin containing a hydroxyl group (—OH) or an alkoxy group (—OR), (2) a material where alkoxysilane is mixed with a silicone resin containing a hydroxyl group (—OH), and (3) a material where a silicone resin containing a hydrosilyl group (—SiH) is mixed with, for example, an acrylic resin or epoxy resin containing a vinyl group (—CH=CH$_2$). In the organic-inorganic hybrid materials, those containing a silicone resin are called a polydimethylsiloxane (PDMS) organic-inorganic hybrid material.

The organic-inorganic hybrid material is not particularly limited and may be appropriately prepared or commercially available. Examples of the commercially available organic-inorganic hybrid material include CONPOCERANE (product of Arakawa Chemical Industries, Ltd.) and GLASKA (product of JSR).

—Solvent—

It is necessary for the insulating film-forming material not to dissolve the pillar formed in the pillar formation step. In other words, a combination of the solvent for the insulating film-forming material and the solvent of the pillar-forming liquid is important. Here, when the inorganic nanoparticles are used as the pillar material, they are not dissolved by the insulating film-forming material. Thus, in this case, any insulating film-forming material may be used.

Meanwhile, when the resin is used as the pillar material, it is necessary to take into consideration a combination of the solvent for the insulating film-forming material and the solvent of the pillar-forming liquid. Preferably, the solvent of the pillar-forming liquid is at least one solvent selected from the group consisting of the following three types of solvents: polar solvents, nonpolar solvents and fluorine-containing solvents which are not compatible together; and the solvent for the insulating film-forming material is selected from the group consisting of the above two types of solvents other than the solvent selected for the pillar-forming liquid. Being solvent-free is also preferable.

The polar solvents are not particularly limited and may be appropriately selected depending on the intended purpose. Example of the polar solvents include methanol, ethanol, isopropyl alcohol, n-butanol, n-hexanol, n-octanol, ethylene glycol, diethylene glycol, propylene glycol, 1,3-butylene glycol, benzyl alcohol, 2-methoxyethanol, 2-ethoxyethanol, 2-butoxyethanol, dipropyleneglycolmonomethylether, acetone, methyl ethyl ketone, methyl isobutyl ketone, methyl n-butyl ketone, methyl n-amyl ketone, acetophenone, cyclohexanone, γ-butyrolactone, propylene carbonate, formamide, N,N-dimethylformamide, N,N-dimethylacetoamide, 1,3-dimethyl-2-imidazolidinone, N,N'-dimethylpropyleneurea, 2-pyrrolidinone, N-methylpyrrolidone, nitromethane, nitrobenzene, and methylsulfoxide. These may be used alone or in combination.

The nonpolar solvents are not particularly limited and may be appropriately selected depending on the intended purpose. Examples of the nonpolar solvents include octane, nonane, decane, undecane, dodecane, tridecane, tetradecane, cyclohexane, 3-methylcyclohexane, benzene, toluene, xylene, mesitylene, and tetralin. These may be used alone or in combination.

The fluorine-containing solvents are not particularly limited and may be appropriately selected depending on the intended purpose. Examples of the fluorine-containing solvents include tetradecafluorohexane, perfluoroheptane, octadecafluorooctane, perfluorononane, hexafluorobenzene, octafluorotoluene, octafluorocyclopentene, heptacosafluorotributylamine, perfluorotriethylamine, perfluorotributylamine, perfluorotriamylamine, perfluoro(1,3-dimethylcyclohexane), perfluoromethylcyclohexane, octadecafluorodecahydronaphthalene, and perfluoro-2-methylpentane. These may be used alone or in combination.

The pillar material soluble in the polar solvents is not particularly limited and may be appropriately selected depending on the intended purpose. Examples thereof include epoxy resins, acrylic resins, phenolic resins, polyimide resins, polyamide resins, polyester resins, polyvinyl phenolic resins, polyvinyl alcohol resins, polyvinyl acetate resins, polysulfone resins, fluororesins, copolymer resins or polymer alloys thereof organic insulating films such as polydimethylsiloxane (PDMS); inorganic oxide insulating films such as $SiO_2$ and $Al_2O_3$ prepared from, for example, metal alkoxides or organic metal complexes; and organic-inorganic hybrid films formed of a mixture of the organic insulating films with the inorganic oxide insulating films.

The pillar material soluble in the nonpolar solvents is not particularly limited and may be appropriately selected depending on the intended purpose. Examples thereof include acrylic resins, polydimethylsiloxane (PDMS), and polystyrene.

The pillar material soluble in the fluorine-containing solvents is not particularly limited and may be appropriately selected depending on the intended purpose. Examples thereof include fluororesins.

Suitable combinations of the solvent for the pillar-forming liquid using the resin with the solvent for the insulating film-forming material include:
(1) a combination of the solvent for the pillar-forming liquid: γ-butyrolactone, with the solvent for the insulating film-forming material: perfluorotributylamine; and
(2) a combination of the solvent for the pillar-forming liquid: γ-butyrolactone, with the solvent for the insulating film-forming material: n-tetradecane, cyclohexane, toluene, or xylen.

—Other Ingredients—

The other ingredients are not particularly limited and may be appropriately selected depending on the intended purpose. Examples of the other ingredients include dispersing agents, stabilizing agents, and curing agents.

The method for forming the insulating film is not particularly limited and may be appropriately selected depending on the intended purpose. Examples of the method include a coating method with which the insulating film-forming material is applied to the entirety of a surface of the base material on which the pillar has been formed; i.e., a target surface.

The coating method is not particularly limited and may be appropriately selected depending on the intended purpose. Examples of the coating method include a spin coating method, a die coating method, a slit coating method, a screen printing method, a dispensing method, an inkjet method and a nozzle coating method. Among them, particularly preferred are a spin coating method, a die coating method and a slit coating method used for coating of the entire surface, from the viewpoints of throughput and uniformity of film thickness.

Also, from the viewpoint of throughput, a nozzle coating method is preferred. The nozzle coating method is a method which applies the insulating film-forming material to the base material at high speed in a line-and-space pattern. The applied insulating film-forming material can be spread over the entire surface of the base material using flowability of the insulating film-forming material.

The material, shape, structure and size of the insulating film are not particularly limited and may be appropriately selected depending on the intended purpose.

The thickness of the insulating film is not particularly limited and may be appropriately selected depending on the intended purpose, but is preferably 0.1 μm to 20 μm, more preferably 0.2 μm to 10 μm, particularly preferably 0.4 μm to 5 μm.

The thickness of the insulating film can be measured with, for example, a stylus profilometer.

<Pillar Removal Step>

The pillar removal step is a step of removing the pillar to form an opening in the insulating film.

When the pillar obtained after the insulating film formation step is completely covered with the resin, it becomes difficult to remove the pillar. Thus, prior to the pillar removal step, the resin on the pillar may be subjected to ashing through plasma etching using gas such as Ar or $O_2$.

The method for removing the pillar is not particularly limited and may be appropriately selected depending on the intended purpose. Examples of the method include: (1) a method in which a solution capable of dissolving the pillar is used to dissolve the pillar through, for example, dipping; and (2) a method in which the pillar is gasified through heat treatment for removal.

When the material of the pillar is a resin, the solution capable of dissolving the pillar in the method (1) above is, for example, a solvent of the pillar-forming liquid (ink) or a solvent having the same polarity as the solvent of the pillar-forming liquid (ink). Examples of the solvent include acetone, γ-butyrolactone, and N-methylpyrrolidone.

When the material of the pillar is inorganic nanoparticles, for example, there can be used etchants each containing nitric acid, hydrochloric acid, sulfuric acid, phosphoric acid, boric acid and acetic acid which are appropriately mixed together.

When the material of the pillar is silver nanoparticles, the etchant used is preferably phosphoric acid, nitric acid or acetic acid.

The opening is not particularly limited and may be appropriately selected depending on the intended purpose, so long as it is formed in the insulating film and is a through hole penetrating to the lower electrode. The shape of the opening is not particularly limited and may be appropriately selected depending on the intended purpose. It is preferably circular or square. When the shape of the opening is an inverse tapered shape (tapering to the top), it is possible to control the taper shape in the below-described heat treatment step. For example, the inverse tapered shape can be deformed to be a forward tapered shape (tapering to the bottom).

The maximum diameter of the opening is not particularly limited and may be appropriately selected depending on the intended purpose, but is preferably 40 μm or less, more preferably 20 μm or less. When the maximum diameter falls within the above more preferred range, it is possible to fabricate high-density electronic devices, which is advantageous.

The maximum diameter of the opening can be measured with, for example, an optical microscope.

<Heat Treatment Step>

The heat treatment step is a step of heat treating the insulating film in which the opening has been formed.

The heat treatment step forms the opening in the insulating film into a tapered shape.

—Heat Treatment—

By heat treating the insulating film, projected portions at the periphery of the opening are deformed downward as a result of softening of the insulating film (thermal deformation). This thermal deformation forms a smooth forward tapered shape which can easily be filled with an electrically conductive material.

When the insulating film is made of thermoplastic resin, heating at a temperature exceeding the softening temperature of the insulating film can easily make the insulating film to be softened, thereby causing thermal deformation.

When the insulating film is made of thermosetting resin, the insulating film decreases in viscosity with increasing of the temperature in the temperature region equal to or lower than the curing initiation temperature of the insulating film-forming material. By using that temperature range, it is possible to cause thermal deformation of the insulating film. For example, heating the insulating film at the temperature below curing initiation temperature before curing the insulating film can cause thermal deformation of the insulating film. And also controlling a rate of temperature rise of the temperature of the heating process, for example 1 degree/minute, from room temperature to the curing temperature can cause thermal deformation of the insulating film by the time the temperature reaches the curing temperature.

When the insulating film is made of UV-curable resin, heating at a desired temperature prior to curing of the insulating film-forming material can cause thermal deformation.

The heating temperature in the heat treatment is not particularly limited and may be appropriately selected depending on the viscosity determined by, for example, the molecular structure and molecular weight of the insulating film-forming material. It is preferably 100° C. to 500° C., more preferably 120° C. to 450° C. When the heating temperature is lower than 100° C., in the case of electronic devices, water may remain to result in degradation of insulating properties. Whereas when the heating temperature is higher than 500° C., such a high temperature may adversely affect other materials to a greater extent, leading to great limitation to employable materials.

Notably, when another heat treatment is necessary for other purposes such as thermal curing of the thermosetting resin and removal of the solvent from the thermoplastic resin, this heat treatment may be performed simultaneously with or separately from the above heat treatment.

The shape of the hole formed by heat treating the opening is not particularly limited and may be appropriately selected depending on the intended purpose. It is preferably a forward tapered shape since the hole having such a shape can easily be filled with an electrically conductive material.

The tapered angle of the hole is not particularly limited and may be appropriately selected depending on the intended purpose, but is preferably 60° or less, more preferably 45° or less. In the case of the forward tapered shape which is a preferred shape, the tapered angle of the hole is a positive value.

The tapered angle of the hole refers to an angle formed between a horizontal bottom surface and a tapered surface which is an inner wall surface of the hole the maximum opening diameter of which decreases from top to bottom.

When the tapered angle is higher than 60°, in the case of electronic devices, there may be disconnection of the upper electrode or inclusion of air bubbles during filling of the hole.

Here, the tapered angle of the hole can be measured by, for example, analyzing the profile of one cross-section of the hole with an AFM (atomic force microscope) (product of Pacific Nanotechnology, Inc.).

<Other Steps>

The other steps are not particularly limited and may be appropriately selected depending on the intended purpose. Examples of the other steps include a base material positioning step, a first wiring formation step, and a second wiring formation step which are described below for a method for producing a multilayer wiring.

The hole formation method of the present invention is a simpler process than the photolithography method. In this method, the insulating film can be formed through coating of the entire underlying surface using, for example, spin coating. Thus, the hole formation method is a high throughput process and can achieve cost reduction. Also, by forming a pillar having a high aspect ratio by an electrostatic attraction type inkjet method, it is possible to form a fine forward tapered hole having a maximum diameter of 15 μm in the interlayer insulating film having a thickness of 1.5 μm.

Here, the hole formation method of the present invention will be described in detail with reference to the drawings.

Figure 1B:
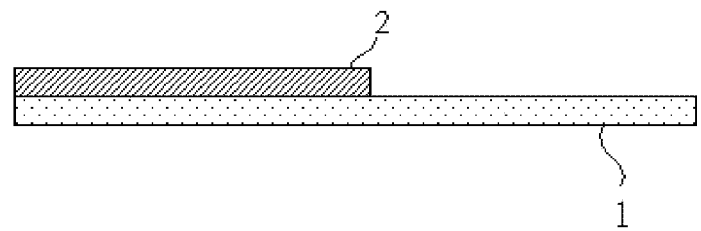
FIG. 1B illustrates one exemplary method of the present invention for producing a multilayer wiring (part 2).
Figure 1C:
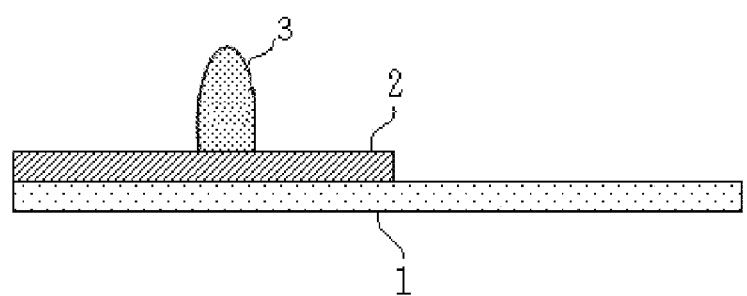
FIG. 1C illustrates one exemplary method of the present invention for producing a multilayer wiring (part 3).
Figure 1D:
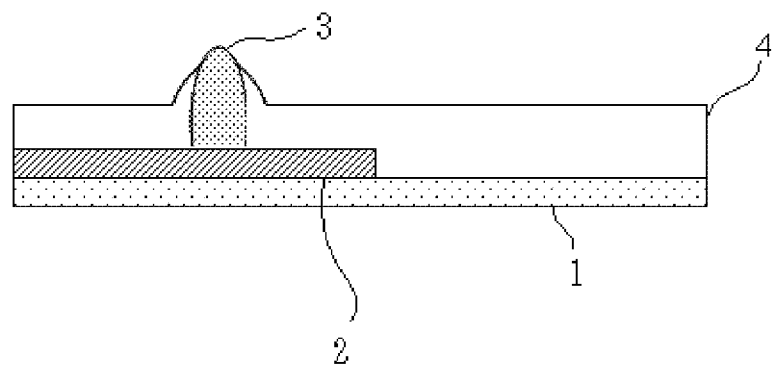
FIG. 1D illustrates one exemplary method of the present invention for producing a multilayer wiring (part 4).
Figure 1E:
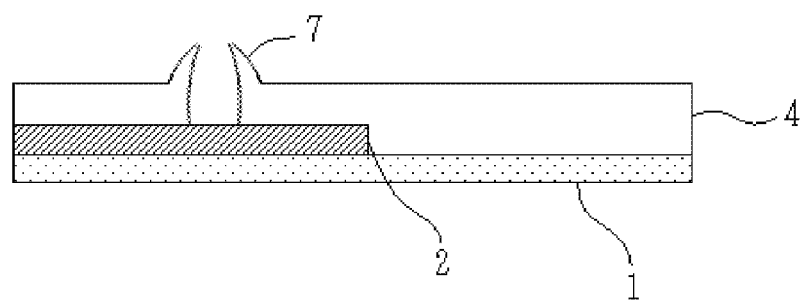
FIG. 1E illustrates one exemplary method of the present invention for producing a multilayer wiring (part 5).

As illustrated in FIGS. 1A to 1F, the opening is formed as follows in the hole formation method of the present invention. Specifically, in the pillar formation step, a pillar 3 is formed on a base material (first wiring 2) 1 in a region 2 where a hole (via hole) is to be formed (FIG. 1C). Next, in the insulating film formation step, an insulating film 4 is formed on the base material (first wiring 2) on which the pillar 3 has been formed (FIG. 1D). Next, in the pillar removal step, the pillar 3 is removed to form the opening (FIG. 1E).

Figure 1F:
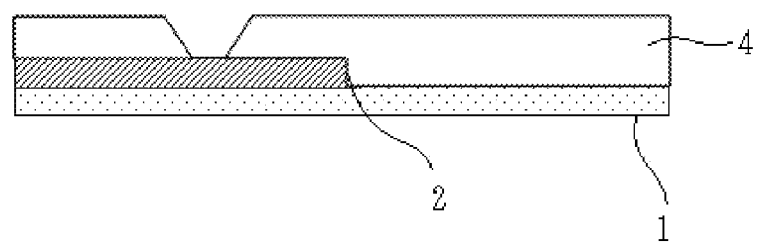
FIG. 1F illustrates one exemplary method of the present invention for producing a multilayer wiring (part 6).

Then, in the heat treatment step, the projected portions at the periphery of the opening deform as a result of softening of the insulating film (thermal deformation). This thermal deformation can control the taper shape to form a forward tapered hole (FIG. 1F).

Referring to Japanese Patent (JP-B) Nos. 3975272 and 4590493, next will be described the electrostatic attraction type inkjet method used in the pillar formation step with reference to the drawings.

The electrostatic attraction type inkjet method is a method of applying a desired voltage between a substrate and a nozzle where the nozzle has a pillar-forming liquid (ink) and an electrode therein, to thereby eject the pillar-forming liquid (ink). In this method, adjusting the inner diameter of the nozzle to a value of 8 μm or less and the distance between the nozzle and the substrate to a value of 100 μm or less generates, at the tip of the nozzle, local electric field concentration stronger than the electric field between the nozzle and the substrate, to thereby separate and eject liquid droplets from the nozzle.

In this method, the smaller the nozzle diameter is, the smaller the minimum voltage necessary for discharging can be. Since the liquid droplets separated from the nozzles are given kinetic energy high enough to overcome air resistance, even small liquid droplets can be applied onto the substrate.

The electrostatic attraction type inkjet method can form the pillar as described above.

Next will be described the mechanism and method of forming the pillar by the electrostatic attraction type inkjet method in the present invention.

As described above, the electrostatic attraction type inkjet method can eject liquid droplets using a nozzle having an inner diameter of 8 μm or less. Thus, this method can eject fine liquid droplets of 1 pL or less, which are hardly ejected by the currently used inkjet methods (piezo inkjet method, thermal inkjet method). The fine liquid droplets can be rapidly dried since they have remarkably high evaporation speed resulting from the action of the surface tension and the large specific surface area. The applied electric field acts on the tip portion of the structure previously formed on the base material through solidification of the liquid droplets applied onto the base material, to thereby cause electric field concentration. Such rapid drying property of the fine liquid droplets and electric field concentration can form the pillar.

Figure 22:
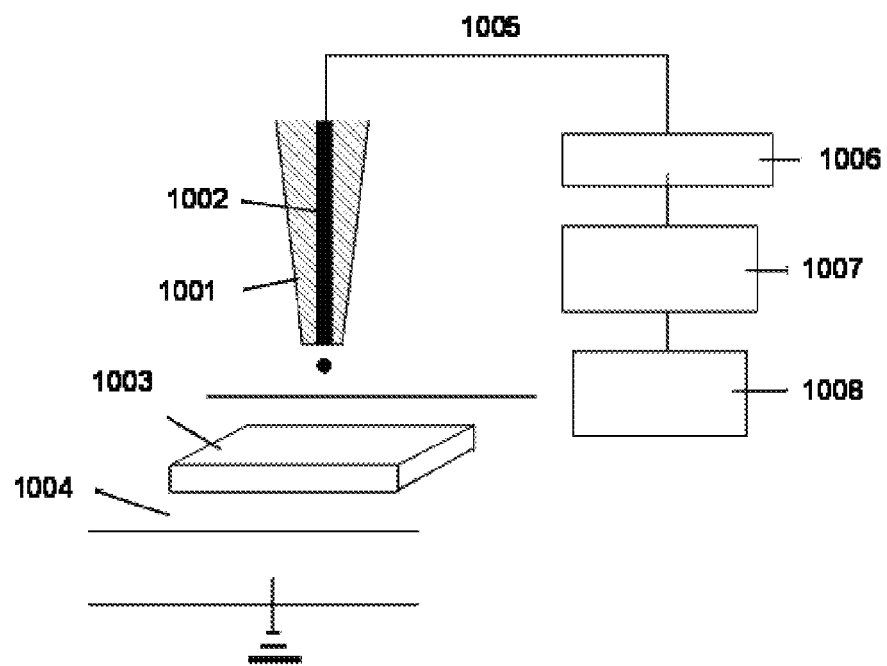
FIG. 22 illustrates a schematic view of one exemplary electrostatically electrostatic attraction type inkjet apparatus.

The method for forming the pillar will next be described below in detail. FIG. 22 illustrates a schematic view of one electrostatic attraction type inkjet apparatus.

The electrostatic attraction type inkjet apparatus illustrated in FIG. 22 is composed of a nozzle 1001, a pillar-forming liquid (ink) 1002, a substrate 1003, a stage 1004, an electrode 1005, a high-voltage amp 1006, a function generator 1007, and a controller (PC) 1008.

In this figure, the electrode 1005 is inserted into the nozzle 1001 to be in contact with the pillar-forming liquid (ink) 1002. The configuration of the apparatus is not particularly limited and may be appropriately selected depending on the intended purpose. For example, at least, it is preferred that the pillar-forming liquid (ink) 1002 be in contact with the electrode 1005.

The nozzle 1001 is not particularly limited and may be appropriately selected depending on the intended purpose. It is preferably made of an insulating material such as glass. The inner diameter of the nozzle 1001 is not particularly limited and may be appropriately selected depending on the intended purpose, but is preferably 8 μm or less. The distance between the nozzle 1001 and the substrate 1003 is preferably 100 μm or less. The stage 1004 is connected to the ground. By applying a desired voltage to the electrode 1005 using the high-voltage amp 1006, the function generator 1007, the controller (PC) 1008, the pillar-forming liquid (ink) 1002 was separated and ejected from the nozzle 1001, and then applied onto the substrate 1003.

The waveform of the voltage applied to the electrode 1005 is not particularly limited and may be appropriately selected depending on the intended purpose. Examples thereof include any alternating current containing square wave, sign wave and triangle wave; direct current, and a combination of alternating current and direct current. The frequency and the voltage as an absolute value are not particularly limited and may be appropriately selected depending on the intended purpose. For example, these values can be optimized for the pillar-forming liquid (ink) 1002.

The pillar-forming liquid (ink) 1002 is not particularly limited and may be appropriately selected depending on the intended purpose. For example, it is preferably an electrically conductive solution or high-permittivity solution. Specifically, the pillar-forming liquid preferably has an electrical conductivity of $10 \times 10^{-5}$ S/m or more or a permittivity of 5 or more.

Figures 1, 23A:
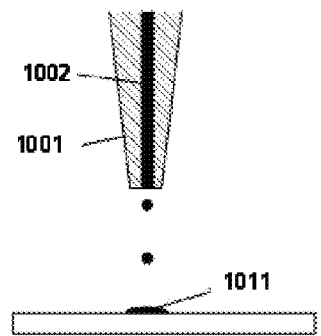
FIG. 23A-1 illustrates one exemplary step of forming a pillar (part 1-1).
Figures 2, 23A:
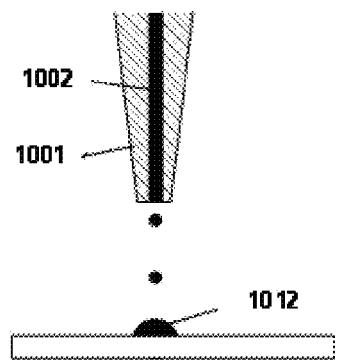
Figures 1, 23B:
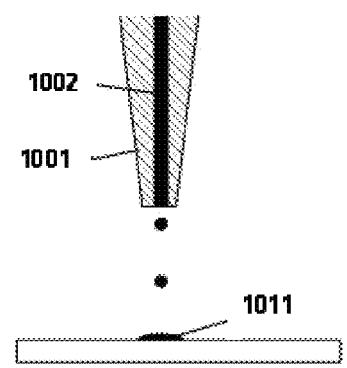
Figures 2, 23B:
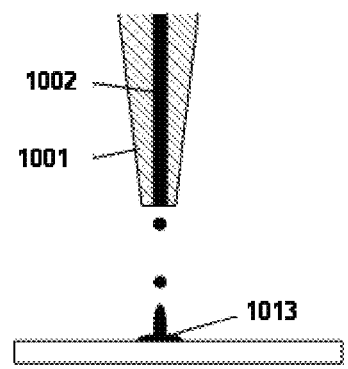
Figures 1, 23C:
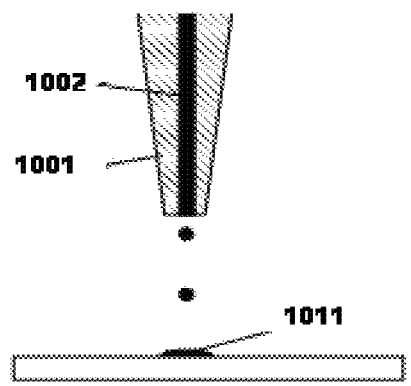
Figures 2, 23C:
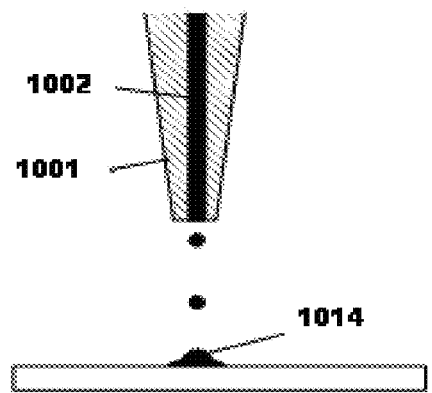
Figures 3, 23C:
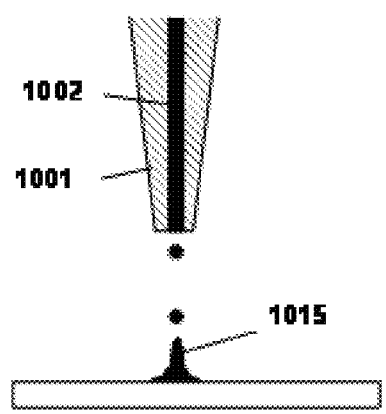

With reference to FIGS. 23A to 23C, the process of forming a pillar on the substrate 1003 using the electrostatic attraction type inkjet apparatus. However, the pillar formation process in the present invention is not limited to this process.

Figure 3:
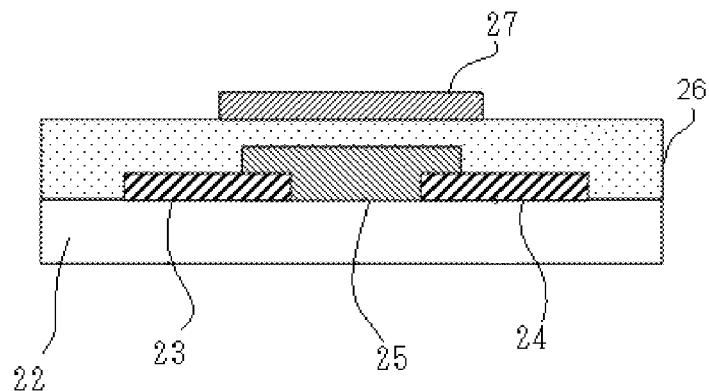
FIG. 3 is a schematic structural view of one exemplary semiconductor device of top gate/bottom contact.

In each case illustrated in FIGS. 23A-1, 23B-1 and 23C-1, an initial structure 1011 in a dot form is formed first. When the pillar-forming liquid (ink) is continued to be ejected, it is wet and spread over the entirety of the initial structure 1011 as illustrated in FIG. 23A-2, so that the initial structure is grown in the height direction to form a pillar 1012 in a dot form. In FIG. 23B-2, the initial structure 1011 is rapidly grown in the height direction through electrical field concentration near the tip thereof, so that a pillar 1013 having a shape shaper than that in FIG. 23A-2 is formed. In the process illustrated in FIGS. 23C-1 to 23C-3, a second structure 1014 is formed on the initial structure as illustrated in FIG. 23C-2, and a pillar 1015 having a sharp shape as illustrated in FIG. 23C-3 is formed through electrical field concentration near the tip of the second structure 1014. The period for which the discharging is performed is not particularly limited and may be any period appropriately selected depending on the intended purpose. Also, the pillar formation is not necessarily performed with one discharging, and may be performed by discharging several times.

Use of the pillar formed through these processes can form a hole (via hole) having a high aspect ratio.

(Multilayer Wiring and Method for Producing the Multilayer Wiring)

A multilayer wiring of the present invention will next be described by way of a method for producing the multilayer wiring.

The method of the present invention for producing a multilayer wiring includes at least a base material positioning step, a first wiring formation step, a pillar formation step, an insulating film formation step, a pillar removal step, a heat treatment step and a second wiring formation step; and, if necessary, further includes other steps.

Figure 1G:
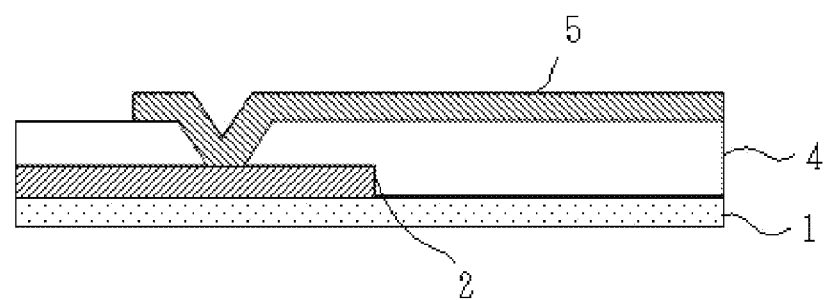
FIG. 1G illustrates one exemplary method of the present invention for producing a multilayer wiring (part 7).

This method produces a multilayer wiring as illustrated in FIG. 1G where a first wiring 2 formed on a base material 1 is electrically connected with a second wiring 5 through a via hole formed in an insulating film 4.

<Base Material Positioning Step>

The base material positioning step is a step of positioning a base material (FIG. 1A).

—Base Material—

The base material is the same base material as described in the above hole formation method.

<First Wiring Formation Step>

The first wiring formation step is a step of forming a first wiring on the base material. For example, a first wiring 2 is formed on a base material 1 as illustrated in FIG. 1B.

—First Wiring—

The shape, structure and size of the first wiring are not particularly limited and may be appropriately selected depending on the intended purpose.

The material of the first wiring is not particularly limited and may be appropriately selected depending on the intended purpose. Examples of the material include: metals such as Mo, Al, Ag and Cu or alloys thereof; transparent electroconductive oxides such as ITO and ATO; and organic electroconductors such as polyethylenedioxythiophene (PEDOT) and polyaniline (PANI).

The method forming the first wiring is not particularly limited and may be appropriately selected depending on the intended purpose. Examples of the method include: (i) a method including forming a film by, for example, a sputtering method or a dip coating method, and patterning the film through photolithography; and (ii) a method in which a film of a desired pattern is directly formed through printing process such as inkjetting, nanoimprinting or gravure printing.

<Pillar Formation Step>

The pillar formation step is a step of forming a pillar on the first wiring in a region where a via hole is to be formed. For example, a pillar 3 is formed on a first wiring 2 as illustrated in FIG. 1C.

—Pillar—

The pillar is the same pillar as described in the above hole formation method.

<Insulating Film Formation Step>

The insulating film formation step is a step of forming an insulating film on the first wiring on which the pillar has been formed. For example, an insulating film 4 is formed on a first wiring 2 on which the pillar 3 has been formed as illustrated in FIG. 1D.

—Insulating Film—

The insulating film is the same insulating film as described in the hole formation method.

<Pillar Removal Step>

The pillar removal step is a step of removing the pillar. For example, an opening having a projected portion 7 at the periphery thereof is formed in the insulating film 4 as illustrated in FIG. 1E.

<Heat Treatment Step>

The heat treatment step is a step of heat treating the insulating film. This heat treatment causes the peripheral projected portion to thermally deform to makes it possible to control a taper shape. For example, a hole of a forward tapered shape is formed as illustrated in FIG. 1F.

The method for the heat treatment is not particularly limited and may be appropriately selected depending on the intended purpose.

When the material of the insulating film is a resin in which the curing temperature is higher than the softening temperature, the taper shape of a via hole changes from an inverse tapered shape into a smooth forward tapered shape. In the below-described second wiring formation step, this smooth forward tapered shaper can prevent disconnection of the second wiring and entering of air bubbles into the via hole, leading to improved reliability.

Notably, when another heat treatment is necessary for other purposes such as thermal curing of the thermosetting resin and removal of the solvent from the thermoplastic resin, this heat treatment may be performed simultaneously with or separately from the above heat treatment.

<Second Wiring Formation Step>

The second wiring formation step is a step of forming a second wiring on the first wiring and the insulating film. For example, a second wiring 5 is formed on a first wiring 2 and an insulating film 4 as illustrated in FIG. 1G.

The shape, structure and size of the second wiring are not particularly limited and may be appropriately selected depending on the intended purpose.

The material of the second wiring is not particularly limited and may be appropriately selected depending on the intended purpose. Examples of the material include: metals such as Mo, Al, Ag and Cu or alloys thereof; transparent electroconductive oxides such as ITO and ATO; and organic electroconductors such as polyethylenedioxythiophene (PEDOT) and polyaniline (PANI).

The method forming the second wiring is not particularly limited and may be appropriately selected depending on the intended purpose. Examples of the method include: (i) a method including forming a film by, for example, a sputtering method or a dip coating method, and patterning the film through photolithography; and (ii) a method in which a film of a desired pattern is directly formed through printing process such as inkjetting, nanoimprinting or gravure printing.

(Semiconductor Device and Method for Producing the Semiconductor Device)

A semiconductor device of the present invention includes:

at least one circuit containing at least two field effect transistors each containing: a substrate; a gate electrode for applying gate voltage; a source electrode and a drain electrode which are for extracting electric current; a semiconductive layer formed between the source electrode and the drain electrode; and a gate insulating film containing a via hole and formed between the gate electrode and the semiconductive layer;

wherein the drain electrode of one of the field effect transistors is connected with the gate electrode of the other field effect transistor through the via hole of the gate insulating film, and wherein the via hole is formed by the hole formation method according to the present invention.

A semiconductor device of the present invention will next be described by way of a method for producing the semiconductor device.

The method of the present invention for producing a semiconductor device includes: a base material positioning step, a first electrode formation step, a semiconductive layer formation step, a pillar formation step, an insulating film formation step, a pillar removal step, and a heat treatment step and a second electrode formation step; and, if necessary, further includes other steps.

Figure 2A:
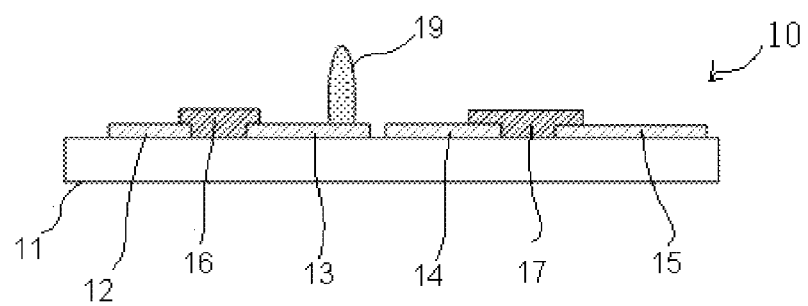
FIG. 2A illustrates one exemplary method of the present invention for producing a semiconductor device (part 1).
Figure 2B:
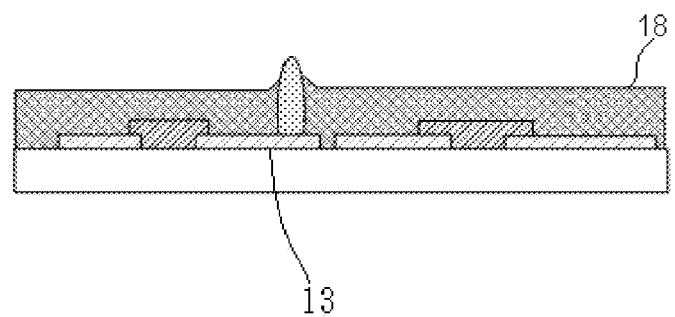
FIG. 2B illustrates one exemplary method of the present invention for producing a semiconductor device (part 2).
Figure 2C:
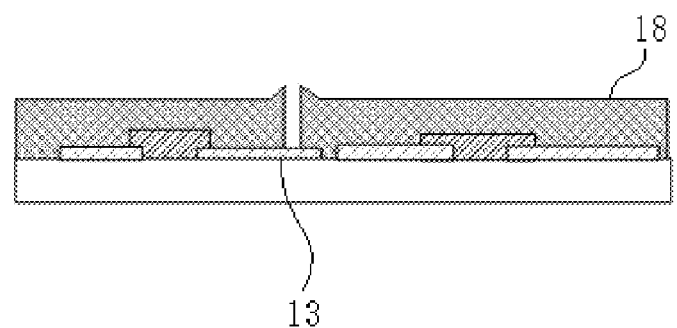
FIG. 2C illustrates one exemplary method of the present invention for producing a semiconductor device (part 3).
Figure 2D:
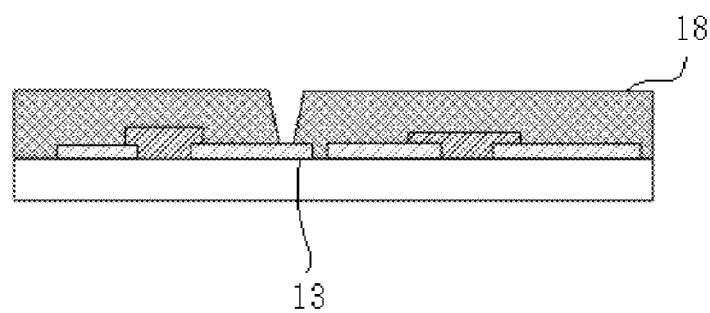
FIG. 2D illustrates one exemplary method of the present invention for producing a semiconductor device (part 4).
Figure 2E:
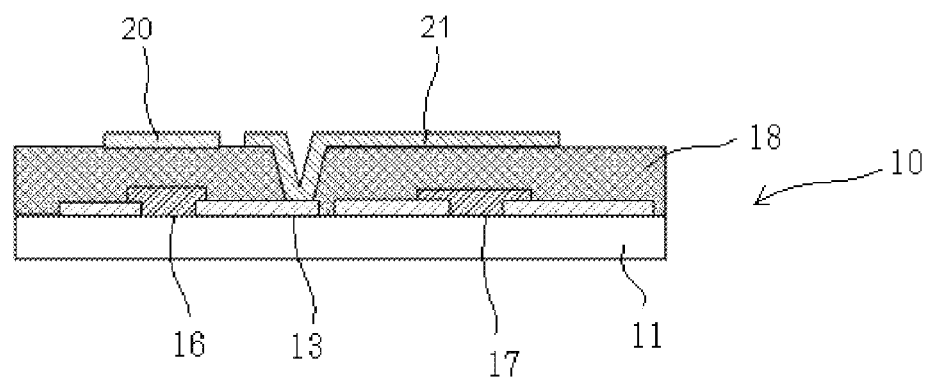
FIG. 2E illustrates one exemplary method of the present invention for producing a semiconductor device (part 5).

Through the method for producing a semiconductor device, for example, a semiconductor device 10 as illustrated in FIG. 2E is produced where a first drain electrode 13 formed on a base material 11 is electrically connected with a second gate electrode 21 through a via hole formed in a gate insulating film 18 provided between the semiconductive layers 16 and 17 and the gate electrodes 20 and 21. The semiconductor device 10 contains two field effect transistors and has a two-transistor, one-capacitor structure. In FIG. 2E, for the sake of convenience, a capacitor is formed between the second source electrode 14 and the second gate electrode 21. However, the position of the capacitor formed is not limited, and a capacitor having a required capacity may appropriately be formed at required positions.

Figure 4:
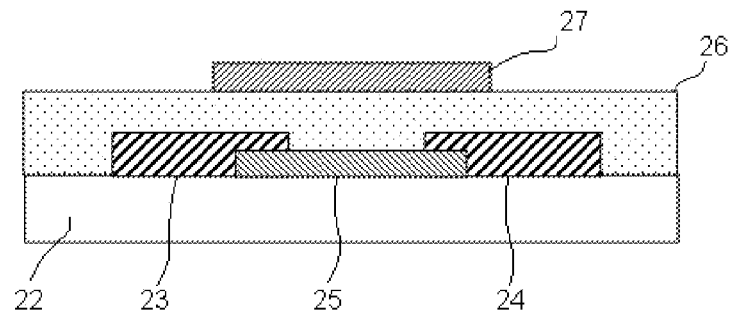
FIG. 4 is a schematic structural view of one exemplary semiconductor device of top gate/top contact.
Figure 5:
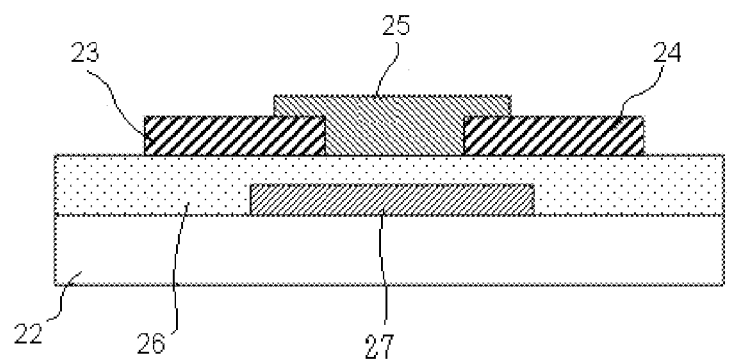
FIG. 5 is a schematic structural view of one exemplary semiconductor device of bottom gate/bottom contact.
Figure 6:
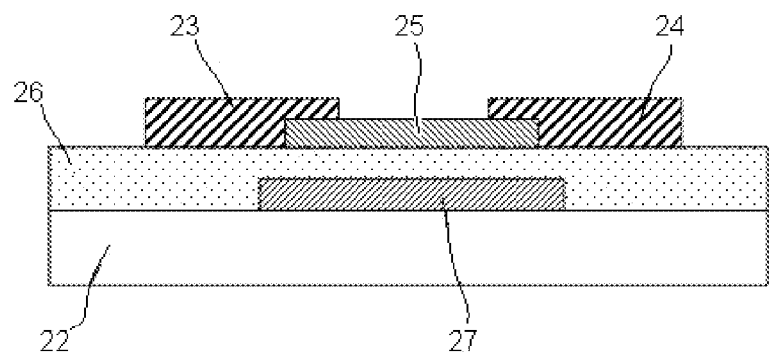
FIG. 6 is a schematic structural view of one exemplary semiconductor device of bottom gate/top contact.

The field effect transistor in the semiconductor device is not particularly limited and may be appropriately selected depending on the intended purpose. Examples of the field effect transistor include a field effect transistor of a top gate/bottom contact type (FIG. 3), a field effect transistor of a top gate/top contact type (FIG. 4), a field effect transistor of a bottom gate/bottom contact type (FIG. 5) and a field effect transistor of a bottom gate/top contact type (FIG. 6).

In FIGS. 3 to 6, reference numeral 22 denotes a base material, reference numeral 23 denotes a source electrode, reference numeral 24 denotes a drain electrode, reference numeral 25 denotes a semiconductive layer, reference numeral 26 denotes a gate insulating film, and reference numeral 27 denotes a gate electrode.

<Base Material Positioning Step>

The base material positioning step is a step of positioning a base material (see FIG. 2A).

The base material is the same base material as described in the above multilayer wiring.

<First Electrode Formation Step>

The first electrode formation step is a step of forming a first electrode on the base material (see FIG. 2A). For example, a first source electrode 12, a first drain electrode 13, a second source electrode 14, and a second drain electrode 15 are formed on the base material 11 as illustrated in FIG. 2A.

The source electrodes 12 and 14 and the drain electrodes 13 and 15 are for extracting electrical current.

—First Electrode—

The shape, structure and size of the first electrode are not particularly limited and may be appropriately selected depending on the intended purpose.

The material of the first electrode is not particularly limited and may be appropriately selected depending on the intended purpose. Examples of the material include metals such as Mo, Al, Ag and Cu or alloys thereof; transparent electroconductive oxides such as ITO and ATO; and organic electroconductors such as polyethylenedioxythiophene (PEDOT) and polyaniline (PANI).

The formation process of the first electrode is not particularly limited and may be appropriately selected depending on the intended purpose. Examples of the process include: (i) a method including forming a film by, for example, a sputtering method or a dip coating method, and patterning the film through photolithography; and (ii) a method in which a film of a desired pattern is directly formed through printing process such as inkjetting, nanoimprinting or gravure printing.

<Semiconductive Layer Formation Step>

The semiconductive layer formation step is a step of first and second semiconductive layers on the base material and the first electrode (see FIG. 2A). For example, a first semiconductive layer 16 is formed on the base material 11 and the first source electrode 12/the drain electrode 13, and a second semiconductive layer 17 is formed on the base material 11 and the second source electrode 14/the drain electrode 15 as illustrated in FIG. 2A.

—Semiconductive Layer—

The shape, structure and size of the semiconductive layer are not particularly limited and may be appropriately selected depending on the intended purpose.

The material of the semiconductive layer is not particularly limited and may be appropriately selected depending on the intended purpose. Examples of the material include polycrystalline silicon (p-Si), amorphous silicon (a-Si), oxide semiconductors such as In—Ga—Zn—O, and organic semiconductors such as pentacene.

The method for forming the semiconductive layer is not particularly limited and may be appropriately selected depending on the intended purpose. Examples of the method include vacuum processes such as a sputtering method, a puls laser deposition (PLD) method, a CVD method, and an ALD method; and printing methods such as dip coating, inkjetting and nanoimprinting.

<Pillar Formation Step>

The pillar formation step is a step of forming a pillar on the first electrode in a region where a via hole is to be formed (see FIG. 2A). For example, a pillar 19 is formed on the first drain electrode 13 in the region where a via hole is to be formed as illustrated in FIG. 2A.

The pillar is the same pillar as described in the multilayer wiring.

<Insulating Film Formation Step>

The insulating film formation step is a step of an insulating film on the first electrode on which the pillar has been formed (see FIG. 2B). For example, a gate insulating film 18 is formed on the first drain electrode 13 on which the pillar 19 has been formed as illustrated in FIG. 2B.

The insulating film is the same insulating film as described in the above multilayer wiring.

<Pillar Removal Step>

The pillar removal step is a step of removing the pillar to form an opening in the insulating film (see FIG. 2C). For example, an opening is formed in the gate insulating film 18 formed on the first drain electrode 13 as illustrated in FIG. 2C.

The method for removing the pillar is not particularly limited and may be appropriately selected depending on the intended purpose. Examples of the method include: (i) a method in which the pillar is immersed in a solvent to dissolve the pillar; and (ii) a method in which the pillar is gasified through heat treatment. Here, in order to remove the pillar, a region of the pillar which is not covered with the insulating film is necessary.

When residues are generated after removal of the pillar, it is possible to remove such residues through ashing by $UV-O_3$ treatment or plasma treatment. The gas used for the plasma treatment is not particularly limited and may be appropriately selected depending on the intended purpose. Examples of the gas include $O_2$, Ar, $CF_4$ and $CHF_3$.

<Heat Treatment Step>

The heat treatment step is a step of heat treating the insulating film (see FIG. 2D). This heat treatment causes the peripheral projected portion to thermally deform to makes it possible to control a taper shape. For example, a hole of a forward tapered shape is formed as illustrated in FIG. 2D.

Notably, when another heat treatment is necessary for other purposes such as thermal curing of the thermosetting resin and removal of the solvent from the thermoplastic resin, this heat treatment may be performed simultaneously with or separately from the above heat treatment.

<Second Electrode Formation Step>

The second electrode formation step is a step of forming a second electrode on the insulating film (see FIG. 2E). For example, second electrodes 20 and 21 are formed on the gate insulating film 18 as illustrated in FIG. 2E.

—Second Electrode—

The second electrode is not particularly limited and may be appropriately selected depending on the intended purpose. Examples of the second electrode include the first gate electrode 20 (FIG. 2E) and the second gate electrode 21 (FIG. 2E). The first and second gate electrodes 20 and 21 apply gate voltage.

The material of the second electrode is not particularly limited and may be appropriately selected depending on the intended purpose. Examples of the material include: metals such as Mo, Al, Ag and Cu or alloys thereof; transparent electroconductive oxides such as ITO and ATO; and organic electroconductors such as polyethylenedioxythiophene (PEDOT) and polyaniline (PANI).

The formation process of the second electrode is not particularly limited and may be appropriately selected depending on the intended purpose. Examples of the process include: (i) a method including forming a film by, for example, a sputtering method or a dip coating method, and patterning the film through photolithography; and (ii) a method in which a film of a desired pattern is directly formed through printing process such as inkjetting, nanoimprinting or gravure printing.

(Display Element)

A display element of the present invention contains at least a light control element and a drive circuit which drives the light control element; and, if necessary, further contains other members.

<Light Control Element>

The light control element is not particularly limited, so long as it is an element which controls output of light based on drive signals, and may be appropriately selected depending on the intended purpose. Examples of the light control element include organic electroluminescence (EL) elements, electrochromic (EC) elements, liquid crystal elements, electrophoretic elements, and electrowetting elements.

<Drive Circuit>

The drive circuit is not particularly limited, so long as it has a via hole formed by the above-described hole formation method, and may be appropriately selected depending on the intended purpose.

<Other Members>

The other members are not particularly limited and may be appropriately selected depending on the intended purpose.

(Display Element and Method for Producing the Display Element)

A first display element of the present invention includes:

a light control element which controls output of light based on drive signals; and a drive circuit which drives the light control element, wherein the drive circuit contains at least one circuit which contains at least two field effect transistors each containing: a substrate; a gate electrode for applying gate voltage; a source electrode and a drain electrode which are for extracting electrical current; a semiconductive layer formed between the source electrode and the drain electrode; and a gate insulating film containing a via hole and formed between the gate electrode and the semiconductive layer, wherein the drain electrode of one of the field effect transistors is connected with the gate electrode of the other field effect transistor through the via hole of the gate insulating film, and wherein the via hole is formed by the hole formation method of the present invention.

Figure 7A:
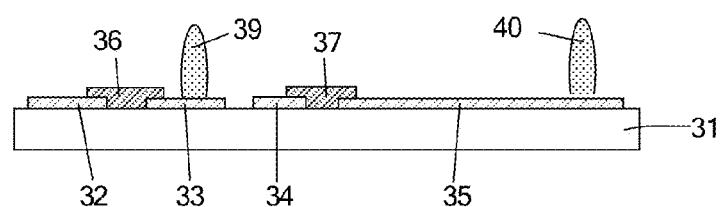
FIG. 7A illustrates one exemplary method of the present invention for producing a display element (part 1).
Figure 7B:
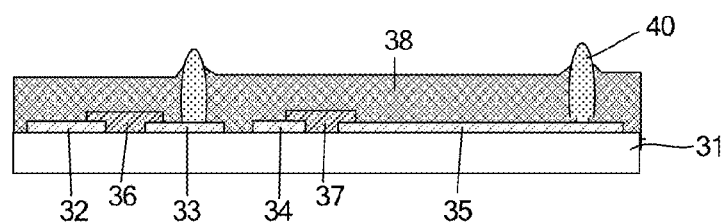
FIG. 7B illustrates one exemplary method of the present invention for producing a display element (part 2).
Figure 7C:
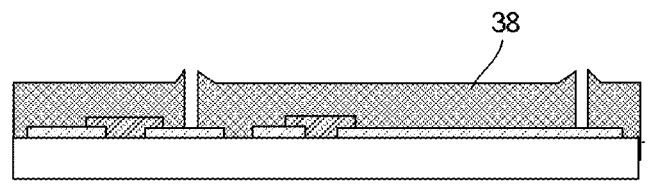
FIG. 7C illustrates one exemplary method of the present invention for producing a display element (part 3).
Figure 7D:
FIG. 7D illustrates one exemplary method of the present invention for producing a display element (part 4).
Figure 7E:
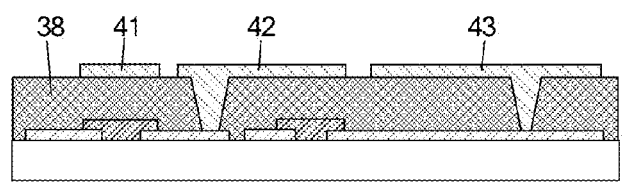
FIG. 7E illustrates one exemplary method of the present invention for producing a display element (part 5).
Figure 7F:
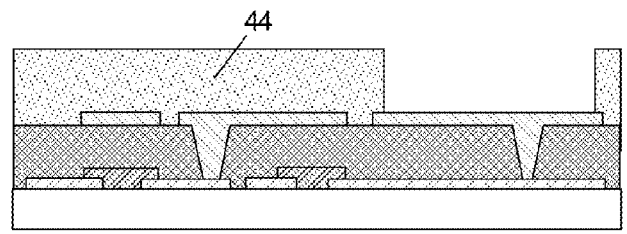
FIG. 7F illustrates one exemplary method of the present invention for producing a display element (part 6).
Figure 7G:
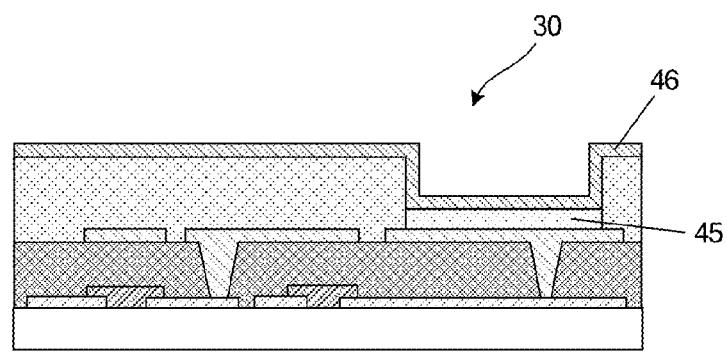
FIG. 7G illustrates one exemplary method of the present invention for producing a display element (part 7).

For example, as illustrated in FIG. 7G, the first display element can be formed as a display element 30 by combining a semiconductor device 10 with an organic EL element 350.

The method for producing the first display element of the present invention will be described.

The method for producing the first display element of the present invention contains at least a base material positioning step, a first electrode formation step, a semiconductive layer formation step, a first pillar formation step, a first insulating film formation step, a first pillar removal step, a first heat treatment step, a second electrode formation step, a surface layer formation step, and a third electrode formation step; and, if necessary, further contains other steps.

This method produces at low cost a display element 30 as illustrated in FIG. 7G where a first drain electrode 33 formed on a base material 31 is electrically connected with a second gate electrode 42 through a via hole formed in a gate insulating film 38; a second drain electrode 35 formed on a base material 31 is connected with a pixel electrode 43 through a via hole formed in the gate insulating film 38; and an organic EL layer and an upper electrode are formed on the pixel electrode 43.

The drive circuit of the display element 30 has at least two field effect transistors and may be appropriately selected from drive circuits each containing a plurality of field effect transistor/capacitor structures, such as a two-transistor, one-capacitor structure and a five-transistor, two-capacitor structure.

Also, the display layer may be appropriately selected from an organic EL layer, an electrochromic layer, an electrophoretic layer, and an electrowetting layer.

In FIGS. 7E to 7G, for the sake of convenience, a capacitor seem to be formed between the second source electrode 34 and the second gate electrode 42 or between the second drain electrode 35 and the pixel electrode 43. The position of the capacitor formed is not limited, and a capacitor having a required capacity may appropriately be formed at required positions.

<Base Material Positioning Step>

The base material positioning step is a step of positioning a base material (see FIG. 7A).

The base material is the same base material as described in the multilayer wiring.

<First Electrode Formation Step>

The first electrode formation step is a step of forming a first electrode on the base material (see FIG. 7A). For example, a first source electrode 32/a drain electrode 33 and a second source electrode 34/a drain electrode 35 are formed on a base material 31 as illustrated in FIG. 7A.

The material, shape, structure, size and formation method of the first electrode are the same as described for the first electrode of the semiconductor device.

<Semiconductive Layer Formation Step>

The semiconductive layer formation step is a step of forming a semiconductive layer on the base material and the first electrode (see FIG. 7A). For example, as illustrated in FIG. 7A, a first semiconductive layer 36 is formed on the base material 31, the first source electrode 32, and the first drain electrode 33; and a second semiconductive layer 37 is formed on the base material 31, the second source electrode 34 and the second drain electrode 35.

The material, shape, structure, size and formation method of the semiconductive layer are the same as described for the semiconductive layer of the semiconductor device.

<Pillar Formation Step>

The pillar formation step is a step of forming a pillar on the first electrode in a region where a via hole is to be formed (see FIG. 7A). For example, as illustrated in FIG. 7A, a pillar 39 is formed on the first drain electrode 33 in a region where a via hole is to be formed; and a pillar 40 is formed on the second drain electrode 35 in a region where a via hole is to be formed.

<Insulating Film Formation Step>

The first insulating film formation step is a step of forming a first insulating film on the base material, the semiconductive layer and the first electrode (see FIG. 7B). For example, as illustrated in FIG. 7B, a gate insulating film 38 is formed on the base material 31, the semiconductive layers 36 and 37, the source electrodes 32 and 34, and the drain electrodes 33 and 35.

<First Pillar Removal Step>

The pillar removal step is a step of removing the pillar to form an opening in the insulating film (see FIG. 7C). For example, as illustrated in FIG. 7C, an opening is formed in the gate insulating film 38.

<First Heat Treatment Step>

The first heat treatment step is a step of heat treating the first insulating film (see FIG. 7C). This heat treatment causes the peripheral projected portion to thermally deform to makes it possible to control a taper shape. For example, a hole of a forward tapered shape is formed as illustrated in FIG. 7D.

Notably, when another heat treatment is necessary for other purposes such as thermal curing of the thermosetting resin and removal of the solvent from the thermoplastic resin, this heat treatment may be performed simultaneously with or separately from the above heat treatment.

<Second Electrode Formation Step>

The second electrode formation step is a step of forming a second electrode on the first insulating film (see FIG. 7E). For example, as illustrated in FIG. 7E, first and second gate electrodes 41 and 42, and a pixel electrode 43 are formed on the gate insulating film 38.

The material, shape, structure, size and formation method of the second electrode are the same as described for the second electrode of the multilayer wiring.

<Partition Wall Formation Step>

The partition wall formation step is a step of forming a partition wall 44 on the pixel electrode 43 in a region for display other than the opening.

There can be used various material, processes, and patterning methods. Examples of the materials usable include conventionally widely mass-produced materials such as $SiO_2$, and organic materials such as polyimide (PI), acrylic resins and fluorine-containing resins. Examples of the processes usable include a process including forming a film by, for example, a vacuum film-forming method (e.g., a sputtering method or a dip coating method) or a solution process (e.g., spin coating or die coating) and patterning the film through photolithography; and a process in which a film of a desired pattern is directly formed through printing process such as inkjetting or printing using nozzles.

<Display Layer Formation Step>

The display layer formation step is a step of forming a display layer 45 on the pixel electrode 43 (see FIG. 7G).

The display layer may be appropriately selected from an organic EL layer, an electrochromic layer, an electrophoretic layer and an electrowetting layer. The process for forming the display layer is not particularly limited and may be appropriately selected depending on the intended purpose.

<Third Electrode Formation Step>

The third electrode formation step is a step of forming an upper electrode 46 on the display layer 45 (see FIG. 7G).

The material of the third electrode is not particularly limited and may be appropriately selected depending on the intended purpose. Examples of the material include: metals such as Mo, Al, Ag and Cu or alloys thereof; transparent electroconductive oxides such as ITO and ATO; and organic electroconductors such as polyethylenedioxythiophene (PEDOT) and polyaniline (PANI).

The formation process of the third electrode is not particularly limited and may be appropriately selected depending on the intended purpose. Examples of the method include: (i) a method including forming a film by, for example, a vacuum vapor deposition method, a sputtering method or a dip coating method, and patterning the film through photolithography; and (ii) a method in which a film of a desired pattern is directly formed through printing process such as inkjetting, nanoimprinting or gravure printing.

Through these steps, the display element 30 can be produced at low cost.

(Second Display Element)

A second display element of the present invention includes:

a light control element which controls output of light based on drive signals and contains an electrode;

a drive circuit which drives the light control element; and an interlayer insulating film containing a via hole and provided between the light control element and the drive circuit, wherein the drive circuit contains at least one field effect transistor which contains: a substrate; a gate electrode for applying gate voltage; a source electrode and a drain electrode which are for extracting electrical current; a semiconductive layer formed between the source electrode and the drain electrode; and a gate insulating film formed between the gate electrode and the semiconductive layer, wherein the drain electrode of the drive circuit is connected with the electrode through the via hole of the interlayer insulating film, and wherein the via hole is formed by the hole formation method of the present invention.

The method for producing the second display element of the present invention will next be described.

The method for producing the second display element of the present invention contains at least a base material positioning step, a first electrode formation step, a first insulating film formation step, a second electrode formation step, a semiconductive layer formation step, a pillar formation step, a second insulating film formation step, a pillar removal step, a heat treatment step, a third electrode formation step, a display layer formation step and a fourth electrode formation step; and, if necessary, further includes other steps.

Figure 8A:
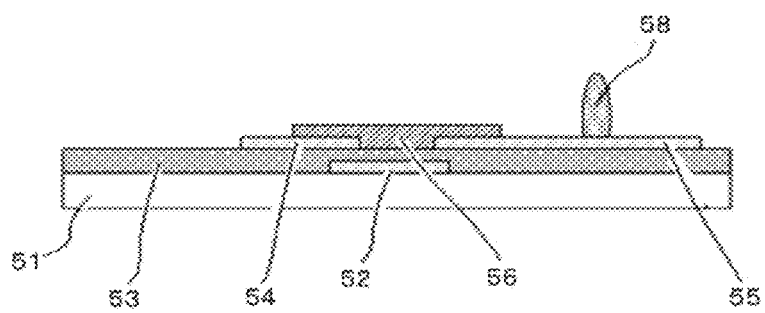
FIG. 8A illustrates another exemplary method of the present invention for producing a display element (part 1).
Figure 8B:
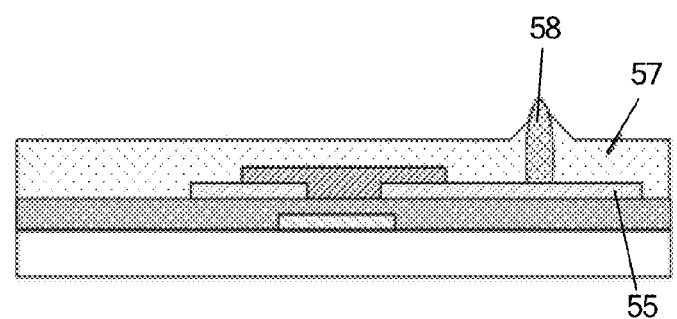
FIG. 8B illustrates another exemplary method of the present invention for producing a display element (part 2).
Figure 8C:
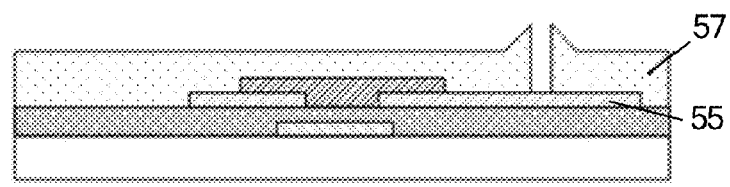
FIG. 8C illustrates another exemplary method of the present invention for producing a display element (part 3).
Figure 8D:
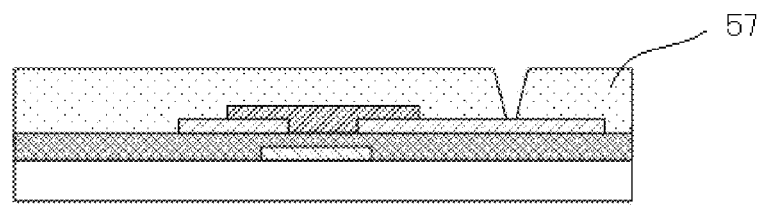
FIG. 8D illustrates another exemplary method of the present invention for producing a display element (part 4).
Figure 8E:
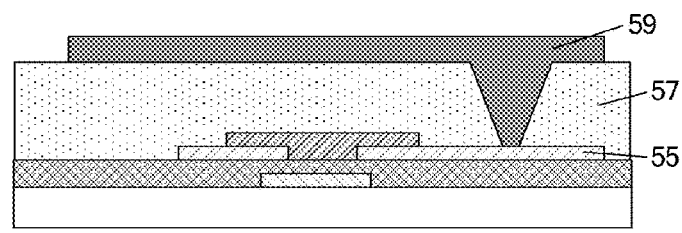
FIG. 8E illustrates another exemplary method of the present invention for producing a display element (part 5).
Figure 8F:
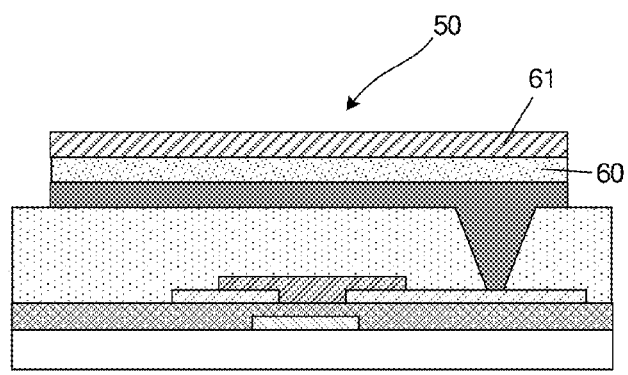
FIG. 8F illustrates another exemplary method of the present invention for producing a display element (part 6).

This method produces at low cost a display element 50 as illustrated in FIG. 8F where a drain electrode 55 formed on the gate insulating film 53 is electrically connected with the pixel electrode 59 through a via hole formed in the interlayer insulating film 57, and a display layer 60 and an upper electrode 61 are further formed.

The number of the field effect transistors of the drive circuit contained in the display element 50 may be one. Alternatively, the display element may have a semiconductor device containing a plurality of field effect transistor/capacitor structures, such as a two-transistor, one-capacitor structure and a five-transistor, two-capacitor structure. Also, the display element may be, for example, an organic electroluminescence (EL) element, an electrochromic element, a liquid crystal element, or an electrowetting layer.

<Base Material Positioning Step>

The base material positioning step is a step of positioning a base material (see FIG. 8A).

The base material is the same base material as described in the multilayer wiring.

<First Electrode Formation Step>

The first electrode formation step is a step of forming a first electrode on the base material (see FIG. 8A). For example, as illustrate in FIG. 8A, a gate electrode 52 is formed on a base material 51.

The material, shape, structure, size and formation method of the first electrode are the same as described for the first electrode of the semiconductor device.

<First Insulating Film Formation Step>

The first insulating film formation step is a step of forming a first insulating film on the base material and the first electrode (see FIG. 8A). For example, as illustrated in FIG. 8A, a gate insulating film 53 is formed on the base material 51 and the gate electrode 52.

For forming the first insulating film, there can be used various material, processes, and patterning methods. Examples of the materials usable include conventionally widely mass-produced materials such as $SiO_2$ and $SiN_x$, high-dielectric-constant materials such as $La_2O_3$ and $HfO_2$, and organic materials such as polyimide (PI) and fluorine-containing resins. Examples of the processes usable include a process including forming a film by, for example, a vacuum film-forming method (e.g., sputtering, chemical vapor deposition (CVD) or atomic layer deposition (ALD)) or a solution process (e.g., spin coating or die coating) and patterning the film through photolithography; and a process in which a film of a desired pattern is directly formed through printing process such as inkjetting or printing using nozzles.

<Second Electrode Formation Step>

The second electrode formation step is a step of forming a second electrode on the first insulating film (see FIG. 8A). For example, as illustrated in FIG. 8A, a source electrode 54 and a drain electrode 55 are formed on the gate insulating film 53.

The material, shape, structure, size and formation method of the second electrode are the same as described for the second electrode of the semiconductor device.

<Semiconductive Layer Formation Step>

The semiconductive layer formation step is a step of forming a semiconductive layer on the second electrode and the first insulating film (see FIG. 8A). For example, as illustrated in FIG. 8A, a semiconductive layer 56 was formed on the gate insulating film 53, the source electrode 54 and the drain electrode 55.

The semiconductive layer is the same semiconductive layer of the above semiconductor device.

Also, a protective layer may be formed on the semiconductive layer.

The material of the protective layer is not particularly limited and may be appropriately selected depending on the intended purpose. Examples of the material include $SiO_2$, $SiN_x$, $Al_2O_3$ and fluorine-containing polymers.

The method for forming the protective layer is not particularly limited and may be appropriately selected depending on the intended purpose. Examples of the method include CVD and sputtering process.

<Pillar Formation Step>

The pillar formation step is a step of forming a pillar on the second electrode in a region where a via hole is to be formed (see FIG. 8A). For example, as illustrated in FIG. 8A, a pillar 58 is formed on the drain electrode 55 in a region where a via hole is to be formed.

—Pillar—

The pillar is the same pillar as described in the above multilayer wiring.

<Second Insulating Film Formation Step>

The second insulating film formation step is a step of forming a second insulating film on the second electrode on which the pillar has been formed (see FIG. 8B). For example, as illustrated in FIG. 8B, an interlayer insulating film 57 is formed on the drain electrode 55 on which the pillar 58 has been formed.

The second insulating film is the same insulating film as described in the above multilayer wiring.

<Pillar Removal Step>

The pillar removal step is a step of removing the pillar to form an opening in the insulating film (see FIG. 8C). For example, as illustrated in FIG. 8C, a via hole is formed in second insulating film 57 on the drain electrode 55.

<Heat Treatment Step>

The heat treatment step is a step of heat treating the second insulating film (see FIG. 8D). This heat treatment causes the peripheral projected portion to thermally deform to makes it possible to control a taper shape. For example, a hole of a forward tapered shape is formed as illustrated in FIG. 8D.

Notably, when another heat treatment is necessary for other purposes such as thermal curing of the thermosetting resin and removal of the solvent from the thermoplastic resin, this heat treatment may be performed simultaneously with or separately from the above heat treatment.

<Third Electrode Formation Step>

The third electrode formation step is a step of forming a third electrode on the second electrode and the second insulating film (see FIG. 8E). For example, as illustrated in FIG. 8E, a pixel electrode 59 is formed on the drain electrode 55 and the second insulating film 57.

—Third Electrode—

The shape, structure and size of the third electrode are not particularly limited and may be appropriately selected depending on the intended purpose.

The material of the third electrode is not particularly limited and may be appropriately selected depending on the intended purpose. Examples of the material include: metals such as Mo, Al, Ag and Cu or alloys thereof; transparent electroconductive oxides such as ITO and ATO; and organic electroconductors such as polyethylenedioxythiophene (PEDOT) and polyaniline (PANI).

The method forming the third electrode is not particularly limited and may be appropriately selected depending on the intended purpose. Examples of the method include: (i) a method including forming a film by, for example, a sputtering method or a dip coating method, and patterning the film through photolithography; and (ii) a method in which a film of a desired pattern is directly formed through printing process such as inkjetting, nanoimprinting or gravure printing.

<Display Layer Formation Step>

The display layer formation step is a step of forming a display layer 60 on the third electrode (FIG. 8F).

The display layer may be appropriately selected from an organic EL layer, an electrochromic layer, an electrophoretic layer and an electrowetting layer. The process for forming the display layer is not particularly limited and may be appropriately selected depending on the intended purpose.

<Fourth Electrode Formation Step>

The fourth electrode formation step is a step of forming an upper electrode 61 on the display layer 60 (FIG. 8F).

The material of the fourth electrode is not particularly limited and may be appropriately selected depending on the intended purpose. Examples of the material include: metals such as Mo, Al, Ag and Cu or alloys thereof; transparent electroconductive oxides such as ITO and ATO; and organic electroconductors such as polyethylenedioxythiophene (PEDOT) and polyaniline (PAM).

The method forming the fourth electrode is not particularly limited and may be appropriately selected depending on the intended purpose. Examples of the method include: (i) a method including forming a film by, for example, a sputtering method or a dip coating method, and patterning the film through photolithography; and (ii) a method in which a film of a desired pattern is directly formed through printing process such as inkjetting, nanoimprinting or gravure printing.

Through these steps, the display element 50 can be produced at low cost.

(System)

A system of the present invention includes at least the image display device of the present invention and an image data output device.

The image data output device generates image data based on image information to be displayed, and outputs the image data to the image display device.

(Image Display Device)

An image display device of the present invention includes at least a display element, a wiring, and a display control device, and, if necessary, further includes other members.

<Display Element>

The display element is not particularly limited and may be appropriately selected depending on the intended purpose, provided that it is the display element of the present invention arranged in a matrix form.

<Wiring>

The wiring is not particularly limited and may be appropriately selected depending on the intended purpose, provided that it can individually apply gate voltage to each field effect transistor in the display element.

<Display Control Device>

The display control device is not particularly limited and may be appropriately selected depending on the intended purpose, provided that it can individually control gate voltage in each field effect transistor via a plurality of lines based on image data.

<Other Members>

The other members are not particularly limited and may be appropriately selected depending on the intended purpose.

A television device as a system of the present invention will be described in reference with FIG. 9.

Figure 9:
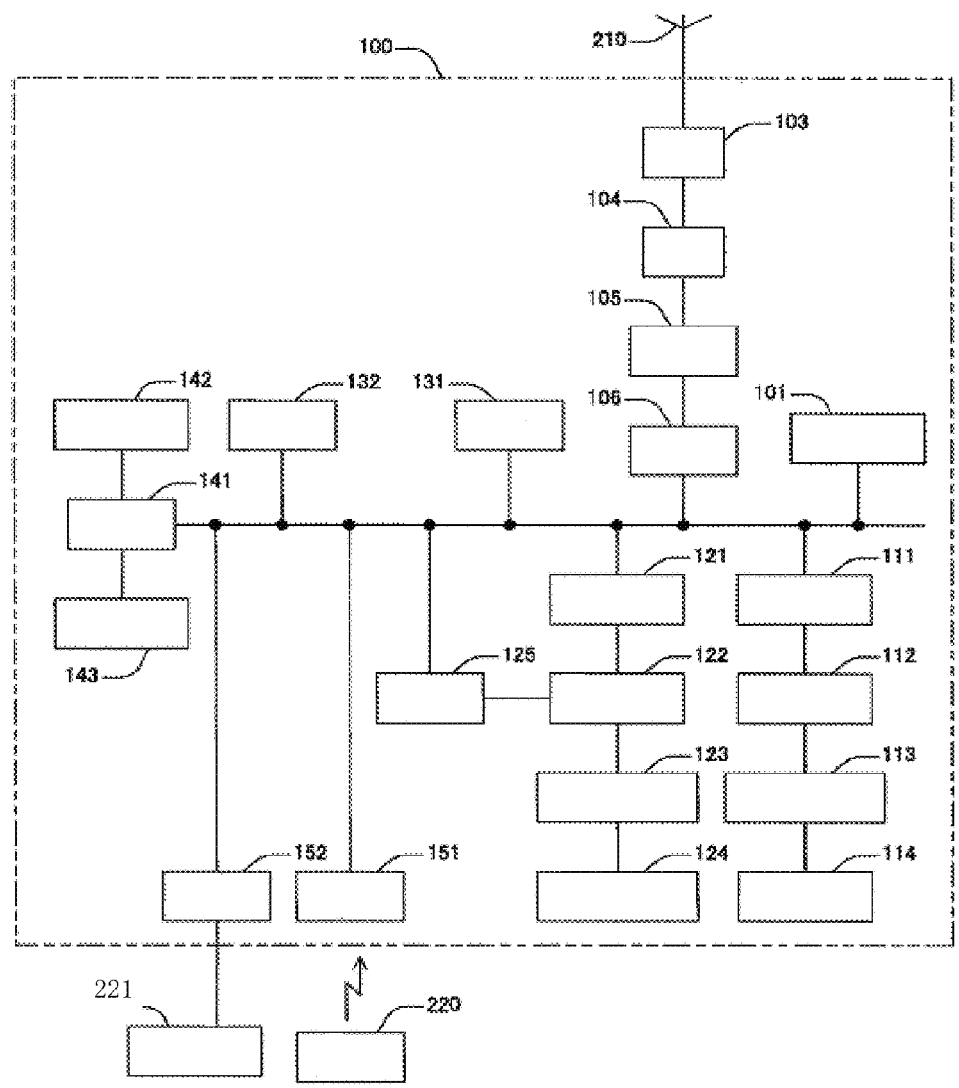
FIG. 9 is a schematic flow chart of one exemplary television device as a system of the present invention.

FIG. 9 is a schematic block diagram of exemplary television device as a system of the present invention. It is note that interconnecting lines illustrated in FIG. 9 represent the flow of typical signals and information, and are not intended to indicate all of the interconnecting relations between each of the blocks.

In FIG. 9, a television device 100 includes a main control device 101, a tuner 103, an AD converter (ADC) 104, a demodulating circuit 105, a TS (Transport Stream) decoder 106, an audio decoder 111, a DA converter (DAC) 112, an audio output circuit 113, a speaker 114, a video decoder 121, an video-OSD synthetic circuit 122, a video output circuit 123, an image display device 124, an OSD drawing circuit 125, a memory 131, an operating device 132, a drive interface (drive IF) 141, a hard disk drive 142, an optical disk drive 143, an IR light receiver 151, and a communication control device 152.

The image data output device is composed of by the video decoder 121, the video-OSD synthetic circuit 122, the video output circuit 123, and the OSD drawing circuit 125.

The main control device 101 is composed of, for example, a CPU, a flash ROM, a RAM, and other members, and controls the whole of the television device 100.

The flash ROM stores, for example, programs written in a CPU-readable code and various data processed in the CPU.

The RAM is a working memory.

The tuner 103 selects a broadcast of a predetermined channel among broadcast waves received by an antenna 210.

The ADC 104 converts a signal (analog information) output from the tuner 103 to digital information.

The demodulating circuit 105 demodulates digital information from ADC 104.

The TS decoder 106 TS-decodes a signal output from the demodulating circuit 105 and separates audio information and video information.

The audio decoder 111 decodes audio information from the TS decoder 106.

The DA converter (DAC) 112 converts a signal output from the audio decoder 111 to an analog signal.

The audio output circuit 113 outputs a signal output from the DA converter (DAC) 112 to the speaker 114.

The video decoder 121 decodes video information from the TS decoder 106.

The video-OSD synthetic circuit 122 synthesizes a signal output from the video decoder 121 and a signal output form the OSD drawing circuit 125.

The video output circuit 123 outputs a signal output from the video-OSD synthetic circuit 122 to the image display device 124.

The OSD drawing circuit 125 includes a character generator for displaying a character and a graphic on a display of the image display device 124, and generates a signal containing display information in response to an instruction from the operating device 132 and the IR light receiver 151.

The memory 131 temporary stores, for example, AV (Audio-Visual) data.

The operating device 132 includes input media (not shown) such as a control panel, and posts various information inputted by a user to the main control device 101.

The drive IF 141 is a two-way communication interface, and as an example, is in accordance with ATAPI (AT Attachment Packet Interface).

The hard disk drive 142 is constituted by, for example, a hard disk, and a drive for driving the hard disk. The drive records data in the hard disk, and reproduces the data recorded in the hard disk.

The optical disk drive 143 records data in an optical disk (e.g., DVD), and reproduces the data recorded in the optical disk.

The IR light receiver 151 receives an optical signal from a remote-control transmitter 220, and posts the optical signal to the mail control device 101.

The communication control device 152 controls a communication with internet 221. Various information can be obtained via internet.

Figure 10:
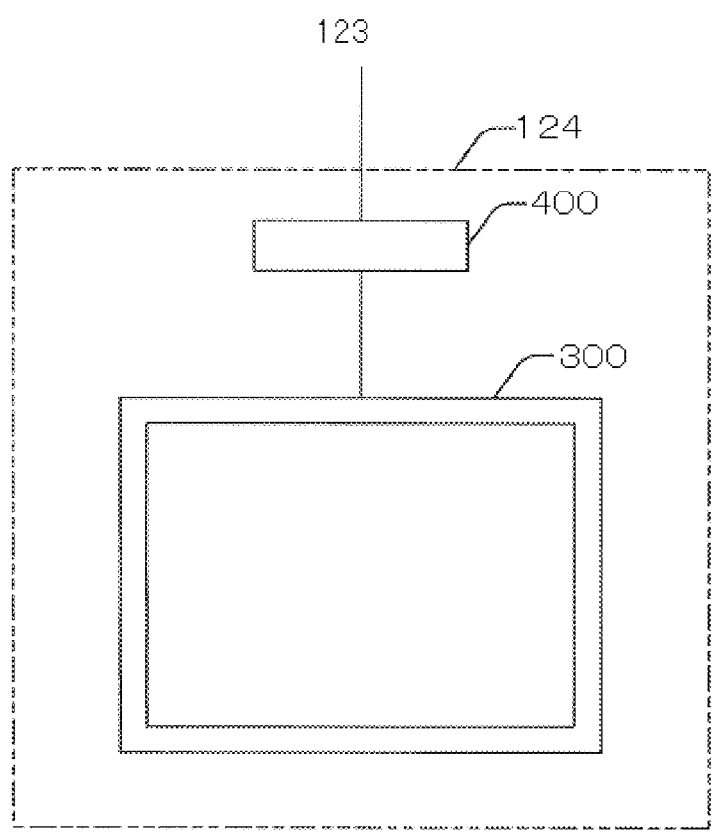
FIG. 10 is an explanatory view of the image display device illustrated in FIG. 9 (part 1).

FIG. 10 schematically illustrates one exemplary configuration of an image display device of the present invention.

In FIG. 10, the image display device 124 includes an indicator 300 and a display control device 400.

Figure 11:
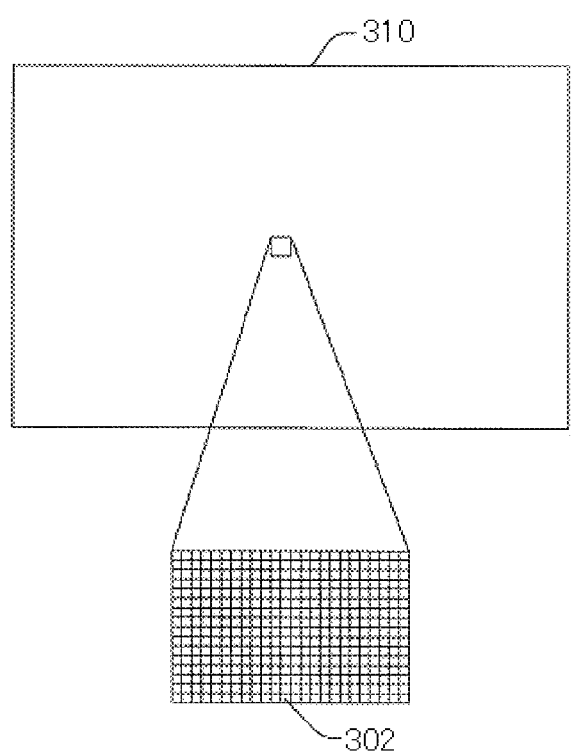
FIG. 11 is an explanatory view of the image display device illustrated in FIG. 9 (part 2).

The indicator 300 has a display 310 in which a plurality of display element 302 (in this figure, the number of the display element 302 is the product of n and m) are arranged in a matrix form, illustrated in FIG. 11.

Figure 12:
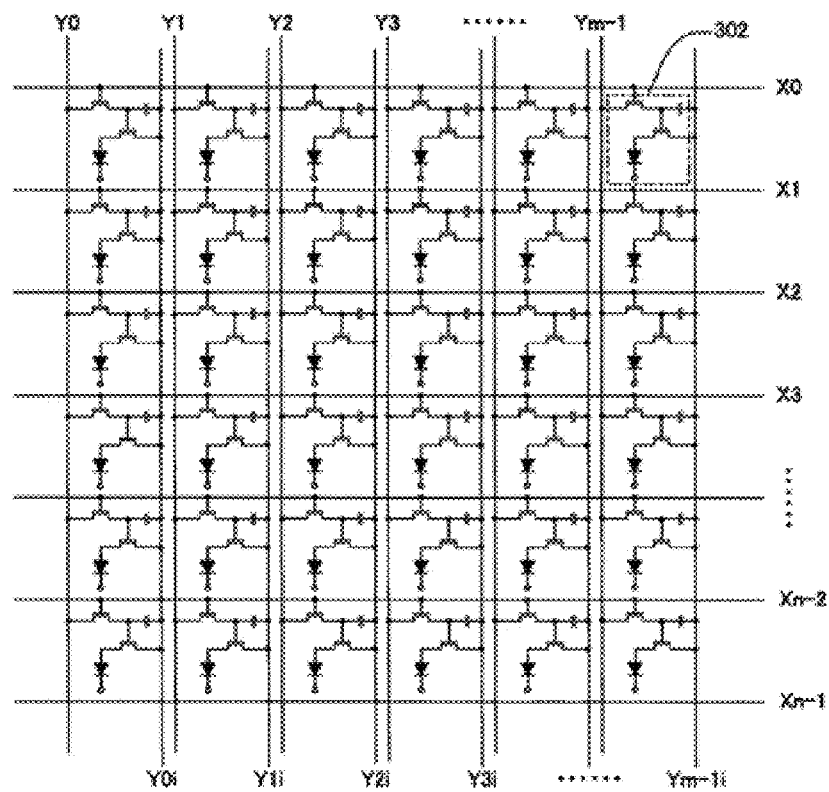
FIG. 12 is an explanatory view of the image display device illustrated in FIG. 9 (part 3).

The display 310 has n scanning lines (X0, X1, X2, X3, . . . , Xn−2, Xn−1) which arranged with equally spaced along a X-axis direction, m data lines (Y0, Y1, Y2, Y3, . . . , Ym−1) which arranged with equally spaced along a Y-axis direction, and m current supply lines (Y0$i$, Y1$i$, Y2$i$, Y3$i$, . . . , Ym−1$i$) which arranged with equally spaced along a Y-axis direction, illustrated in FIG. 12.

Accordingly, the display element can be identified by the scanning line number and the data line number.

Hereinafter, a display element of the present invention will be described in reference with FIG. 13.

Figure 13:
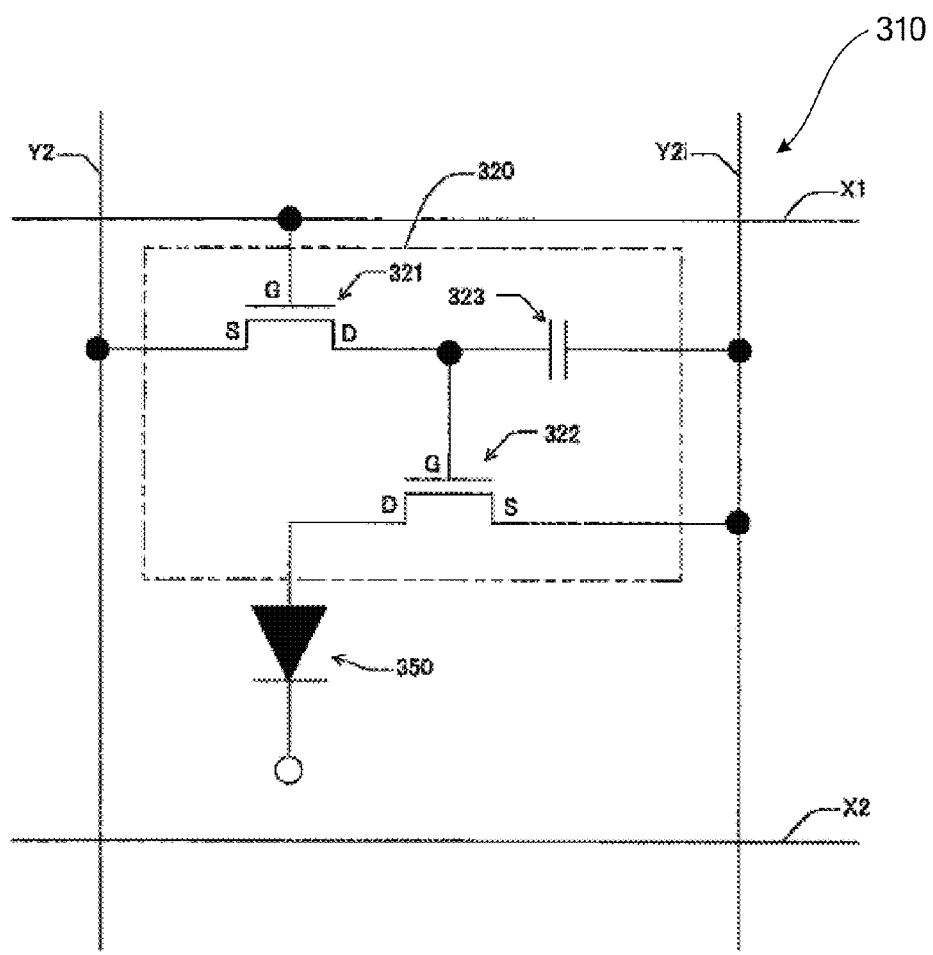
FIG. 13 is an explanatory view of a display device of the present invention.

FIG. 13 schematically illustrates one exemplary configuration of a display element of the present invention.

In FIG. 13, a display 310 shown as a display element is so called an active-matrix organic electroluminescence display, and includes an organic EL (electroluminescence) element 350 as an optical control element and a drive circuit (driving circuit) 320 so as to allow the organic EL element 350 to emit light.

Figure 14:
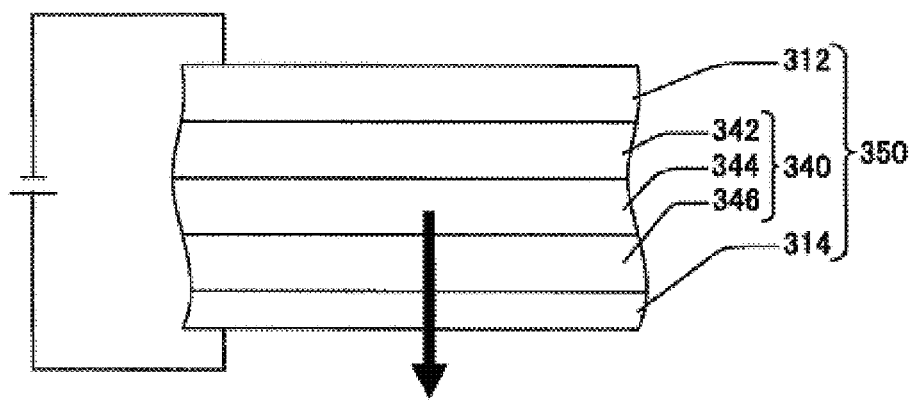
FIG. 14 is a schematic structural view of one exemplary organic EL element.

FIG. 14 is a schematic view of one exemplary organic EL element.

In FIG. 14, the organic EL element 350 includes a negative electrode 312, a positive electrode 314, and an organic EL thin film layer 340. Note in FIG. 14 that the arrow indicates a direction in which light is emitted.

The negative electrode 312 material is not particularly limited and may be appropriately selected depending on the intended purpose. Examples thereof include aluminum (Al), magnesium (Mg)-silver (Ag) alloy, aluminum (Al)-lithium (Li) alloy, and ITO (Indium Tin Oxide). Note that the magnesium (Mg)-silver (Ag) alloy results in a semi-transparent electrode.

The positive electrode 314 material is not particularly limited and may be appropriately selected depending on the intended purpose. Examples thereof include ITO (Indium Tin Oxide), IZO (Indium Zinc Oxide), and silver (Ag)-neodymium (Nd) alloy. Note that the silver (Ag)-neodymium (Nd) alloy results in a high-reflective electrode.

The organic EL thin film layer 340 includes an electron transport layer 342, a light emitting layer 344, and a hole transport layer 346. The electron transport layer 342 is connected with the negative electrode 312, and the hole transport layer 346 is connected with positive electrode 314. When a predetermined voltage is applied between the positive electrode 314 and the negative electrode 312, the light emitting layer 344 emits light.

The electron transport layer 342 and the light emitting layer 344 together can be form one layer. An electron injection layer can be provided between the electron transport layer 342 and the negative electrode 312, and a hole injection layer 346 can be further provided between the hole transport layer 346 and the positive electrode 314.

So called a "bottom emission" type organic EL element in which light is emitted from a side of a substrate has been described, but a "top emission" type organic EL element in which light is emitted from a side opposite to a substrate also can be used.

The drive circuit 320 includes two field effect transistors 321 and 322 (FIG. 13), and a condenser 323 (FIG. 13).

The field effect transistor 321 (FIG. 13) is served as a switch element. A gate electrode G (FIG. 13) is connected with a predetermined scanning line, and a source electrode S (FIG. 13) is connected with a predetermined data line. A drain electrode D (FIG. 13) is connected with one terminal of the condenser 323 (FIG. 13).

The field effect transistor 322 (FIG. 13) supplies much current to the organic EL element 350. A gate electrode G of the field effect transistor 322 (FIG. 13) is connected with the drain electrode D of the field effect transistor 321. A drain electrode D of the field effect transistor 322 (FIG. 13) is connected with the positive electrode 314 of the organic EL element 350. A source electrode S is connected with a predetermined current supply line.

Accordingly, when the field effect transistor 321 is switched on, the field effect transistor 322 drives the organic EL element 350.

The condenser 323 stores a state of the field effect transistor 321, i.e., data. Other terminal of the condenser 323 is connected with a predetermined current supply line.

Figure 15:
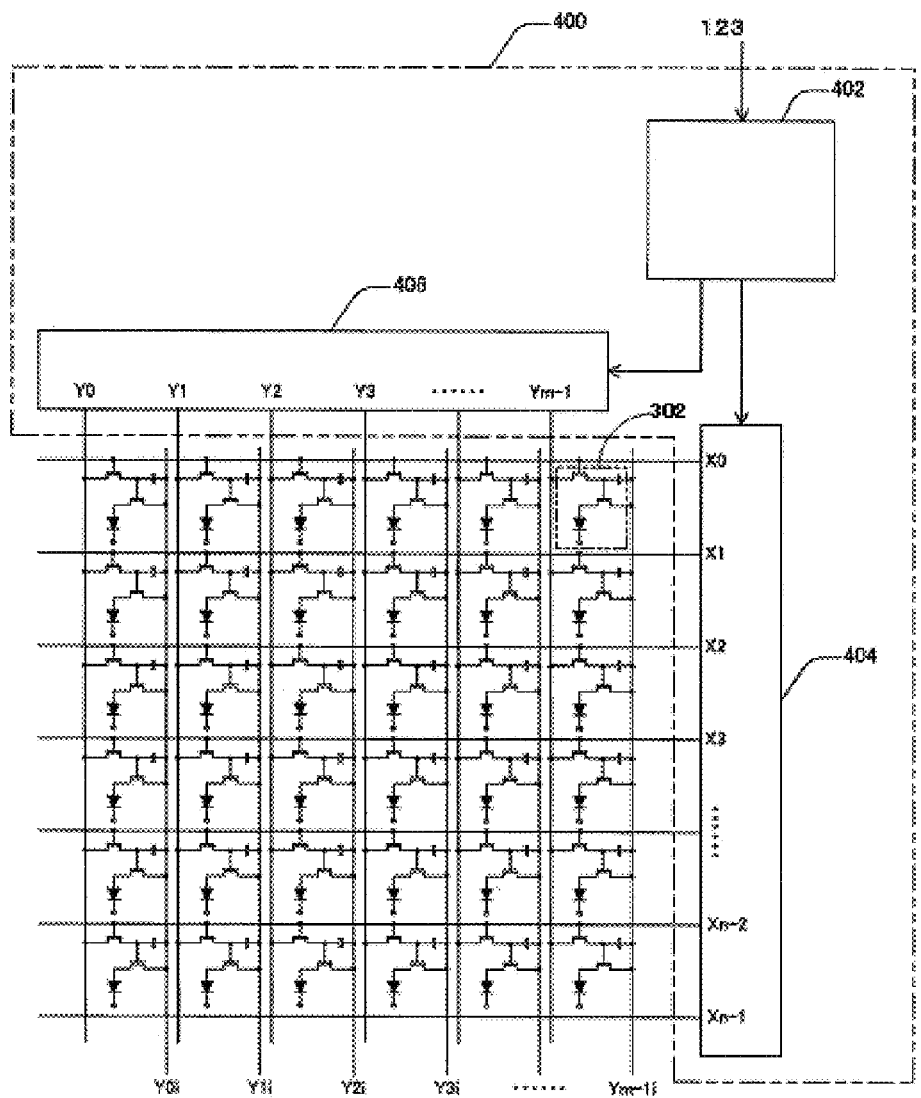
FIG. 15 is an explanatory view of a display control device.

FIG. 15 schematically illustrates another exemplary configuration of an image display device of the present invention.

In FIG. 15, the image display device includes a display element 302, a wiring (scanning lines and data lines), and a display control device 400.

The display control device 400 includes an image data processing circuit 402, a scanning line driving circuit 404, and a data line driving circuit 406.

The image data processing circuit 402 determines the brightness of each of the plurality of display element 302 in the display 310 based on a signal output from a video output circuit 123.

The scanning line driving circuit 404 individually applies voltage to the n scanning lines in response to an instruction from the image data processing circuit 402.

The data line driving circuit 406 individually applies voltage to the m data lines in response to an instruction from the image data processing circuit 402.

As can be seen from the above description, in the television device 100 according to the present embodiment, an image data preparation device is constituted by the video decoder 121, the video-OSD synthetic circuit 122, the video output circuit 123, and the OSD drawing circuit 125.

An image display device can be provided in low cost by utilizing the organic EL element 350 according to the present embodiment, and the display element 30 or the display element 50 as a display element 302 constituted by the drive circuit (driving circuit) 320.

The embodiment in case where an optical control element is an organic EL element has been described, but is not limited thereto. For example, the optical control element may be an electrochromic element. In this case, the display 310 is an electrochromic display.

Figure 16:
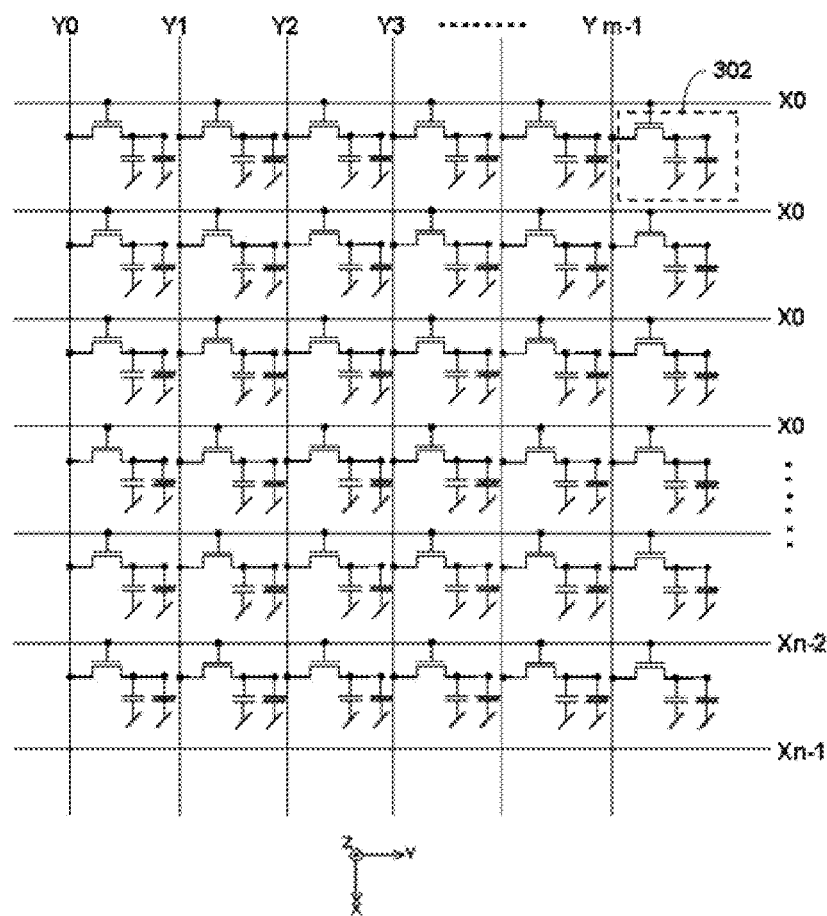
FIG. 16 is an explanatory view of a liquid crystal display.
Figure 17:
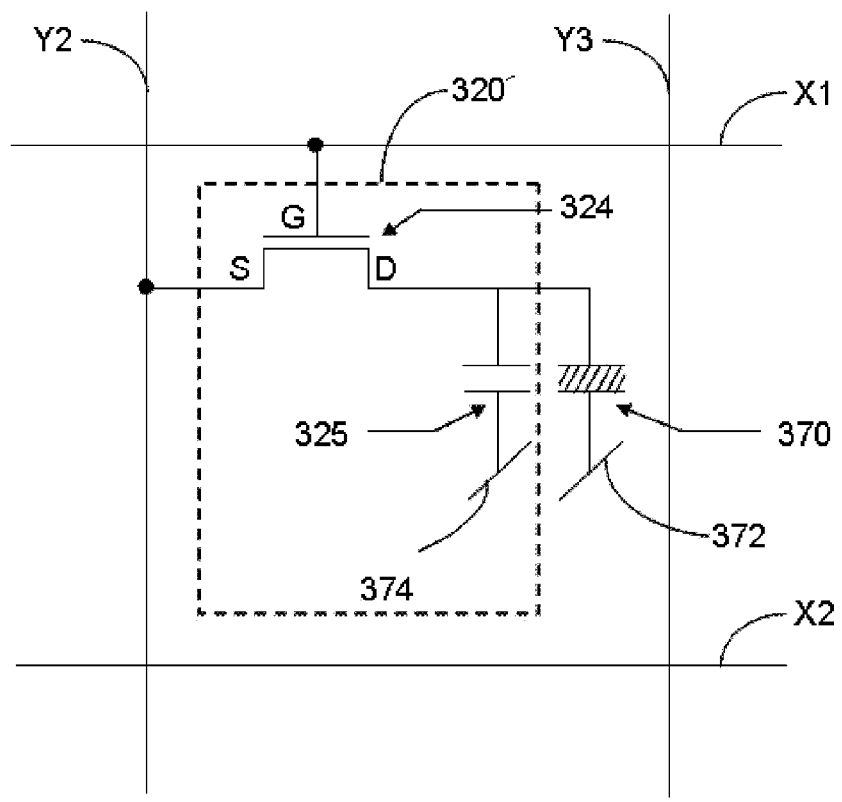
FIG. 17 is an explanatory view of a display element in FIG. 16.

Additionally, the optical control element may be a liquid crystal element, in this case the display 310 is a liquid crystal display, and no current supply line for the display element 302' is required to be used, illustrated in FIG. 16. As illustrated in FIG. 17, the drive circuit 320' can be constituted by a capacitor 325 and field effect transistors 324 and 325 described below which correspond to the field effect transistor 321 and 322. In the field effect transistor 324, a gate electrode G is connected with a predetermined scanning line, and a source electrode S is connected with a predetermined data line. A drain electrode D is connected with the capacitor 325 and a pixel electrode of the liquid crystal element 370.

In this case, a liquid crystal display element can be provided in low cost because the display element 50 can be utilized as the display element 302 which is constituted by the drive circuit 320' and the liquid crystal element 370.

The optical control element may be an electrophoresis element or an electrowetting element.

The embodiment in case where a system of the present invention is a television device has been described, but is not limited thereto. The system may be any system which has an image display device 124 as a device which displays image and information. For example, the system may be a computer system in which a computer, including a personal computer, is connected with an image display device 124.

EXAMPLES

Examples of the present invention will be explained hereinafter, but these examples shall not be construed as limiting the scope of the present invention.

Example 1

As illustrated in FIGS. 18A to 18E, a wiring pattern 72 of a lower electrode was formed on a glass substrate 71 by photolithography.

Specifically, an electrically conductive oxide thin film formed of tin-doped indium oxide (ITO) was formed on a glass substrate having a thickness of 0.7 mm by DC sputtering (name of the apparatus used: i-Miller, product of SHIBAURA MECHATRONICS CORPORATION) at room temperature to give a thickness of 200 nm, followed by subjected to a heat treatment at 250° C. for 30 minutes.

—Formation of Lower Electrode—

Figure 18A:
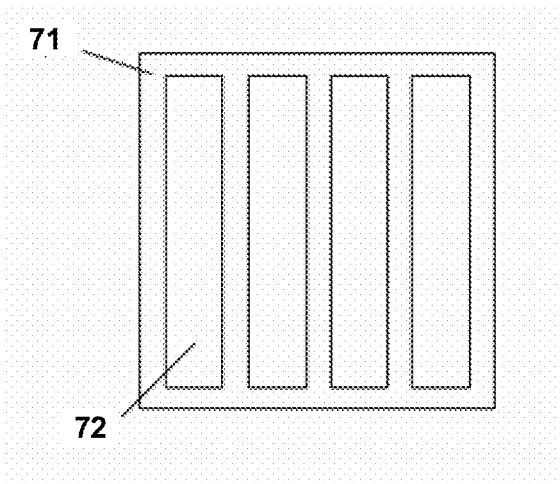
FIG. 18A illustrates a method for producing a multilayer wiring of Example 1 (part 1).

Next, a photoresist was applied onto the electrically conductive oxide tin film formed of ITO by spin coating (name of the apparatus used: 1X-DX2, product of Mikasa Co.), followed by subjected to prebaking at 90° C. for 30 minutes. Subsequently, the photoresist was exposed to g-, h-, i-mixed UV rays through a photomask at 150 mJ/cm$^2$, and then the exposed photoresist was developed with a developer NMD-W2.38, product of Tokyo Ohka Kogyo Co., Ltd., followed by subjected to postbaking at 120° C. for 30 minutes, to thereby form a photoresist pattern. Thereafter, the region of the ITO film on which the resist pattern had not been formed was removed by reactive ion etching (RIE), and then the resist pattern was removed to thereby form the lower electrode 72 formed of the ITO film (FIG. 18A).

—Formation of Pillars—

As a pillar forming liquid, a solution of a thermoplastic acrylic resin (product name: KH-CT-865, product of Hitachi Chemical Co., Ltd.) diluted with γ-butyrolactone was provided. The amount of the thermoplastic acrylic resin in the pillar forming liquid was 25% by mass.

Figure 18B:
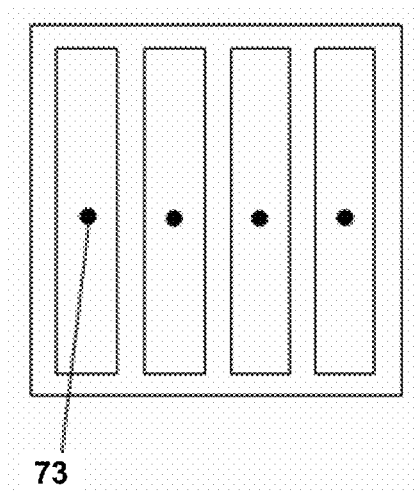
FIG. 18B illustrates a method for producing a multilayer wiring of Example 1 (part 2).

The pillar forming liquid (ink) was ejected onto the lower electrode 72 by an inkjet device (product name: Super Inkjet Device, product of SIJ Technology, Inc.) in accordance with a droplet ejecting method (ejection conditions: voltage of 220 V, frequency of 100 Hz) to thereby form pillars 73 having the maximum diameter of 15 μm, and the maximum height of 7 μm. After forming the pillars 73, they were dried at 65° C. for 30 minutes (FIG. 18B).

—Formation of Insulating Film—

As an insulating film-forming material, a thermoplastic fluororesin in perfluorotributylamine serving as a solvent (CYTOP, product of Asahi Glass Co., Ltd., $(C_6F_{10}O)_n$ (n=about 80,000)) was provided. The amount of the thermoplastic fluororesin in the insulating film-forming material was 9% by mass.

Figure 18C:
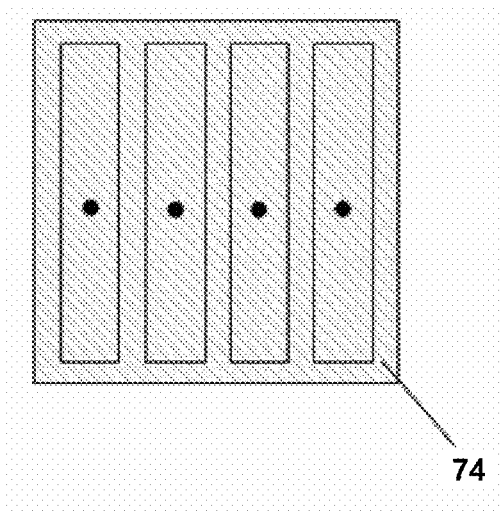
FIG. 18C illustrates a method for producing a multilayer wiring of Example 1 (part 3).

The insulating film-forming material was applied onto the glass substrate 71 on which the lower electrode 72 and pillars 73 had been formed by spin coating (name of the apparatus used: 1X-DX2, product of Mikasa Co.), followed by drying at 65° C. for 30 minutes to thereby form an insulating film 74 having the average thickness of 1 μm (FIG. 18C).

—Removal of Pillars—

Figure 18D:
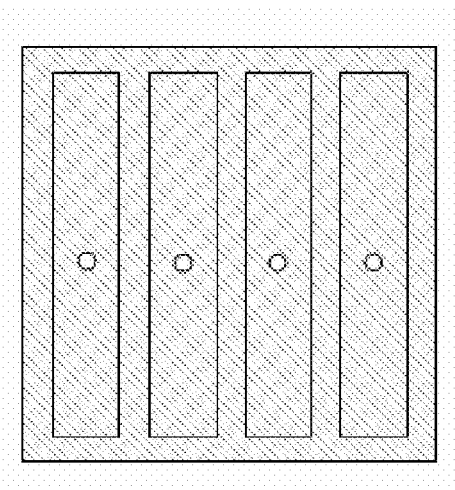
FIG. 18D illustrates a method for producing a multilayer wiring of Example 1 (part 4).

Next, the glass substrate 71 on which the insulating film 74 had been formed was dipped into γ-butyrolactone at room temperature for 5 minutes to dissolve and remove the pillars 73, to thereby form openings each having a projected portion along the rim (FIG. 18D).

—Heat Treatment—

Next, the glass substrate with the insulating film in which the openings had been formed was heated from room temperature to 230° C. at a temperature increasing rate of 1° C./min using an oven (DTS82, product of YAMATO SCIENTIFIC CO., LTD.) and was subjected to a heat treatment at 230° C. for 1 hour to make the projected portion disappear to thereby form holes each tapering to the bottom (forward tapered holes).

Next, ashing was performed with Ar plasma to remove any residues. The conditions for the ashing were the Ar flow rate of 50 sccm, the pressure of 35 Pa, powder of 500 W, and processing duration of 30 seconds.

Figure 18E:
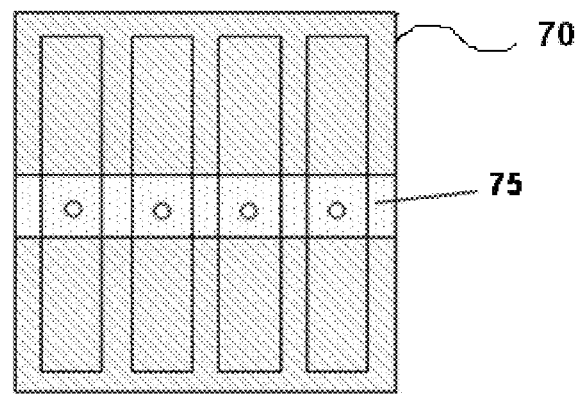
FIG. 18E illustrates a method for producing a multilayer wiring of Example 1 (part 5).

Lastly, an upper electrode 75 was formed by resistance heating vacuum vapor deposition by means of a resistance heating vapor deposition device (name of the apparatus used: EBX-60D, product of ULVAC, Inc.) equipped with a metal mask, and using aluminum as an evaporation source, to thereby form a multilayer wiring 70 (FIG. 18E). The back pressure of the vapor deposition was $3 \times 10^{-6}$ Torr.

<Relationship Between Maximum Height of Pillar Relative to Average Thickness of Insulating Film and Formation of Via Hole>

A multilayer wiring was produced in the same manner as in Example 1, provided that the maximum height of the pillar and the average thickness of the insulating film were changed as presented in Table 1. The relationship between the maximum height of the pillars to the average thickness of the insulating film and the formation of via holes is presented in Table 1.

—Maximum Height of Pillars—

The maximum height of the pillars was obtained by measuring the three-dimensional shape of the pillar using an atomic force microscope (AFM, product of Pacific Nanotechnology, Inc.).

—Average Thickness of Insulating Film—

The average thickness of the insulating film was measured by a stylus profilometer (Alpha-Step IQ, product of KLA Tencor Japan).

—Evaluation of Formation of Via Hole—

After removing the pillars, a profile of one cross section of the insulating film was measured by AFM (product of Pacific Nanotechnology, Inc.), and the result was evaluated based on the following criteria.

[Evaluation Criteria]

A: The pillar shape was changed from a convex shape to a concave shape (i.e., via holes were formed).

B: The pillar shape remained a convex shape (i.e., via holes were not formed).

TABLE 1

| Average thickness of insulating film | | | | | | | |
|---|---|---|---|---|---|---|---|
| 400 nm | | 1,000 nm | | 1,500 nm | | 2,000 nm | |
| Max. height of pillar (μm) | Evaluation | Max. height of pillar (μm) | Evaluation | Max. height of pillar (μm) | Evaluation | Max. height of pillar (μm) | Evaluation |
| 1.04 | B | 1.61 | B | 2.56 | B | 2.37 | B |
| 2.19 | A | 2.30 | B | 3.66 | B | 2.53 | B |
| 5.24 | A | 4.11 | B | 4.96 | B | 4.18 | B |
| 6.34 | A | 5.37 | A | 5.47 | B | 5.31 | B |
| 8.00 | A | 6.81 | A | 7.51 | A | 7.00 | B |

It was found from the results of Table 1 that when the maximum height of the pillars was about 5 times or higher than the average thickness of the insulating film, via holes were formed, and when it is less than about 5 times the average thickness of the insulating film, the pillars were buried in the insulating film and via holes were not formed by dipping in γ-butyrolactone.

Comparative Example 1

A multilayer wiring was formed in the same manner as in Example 1, provided that the heat treatment (the heat treatment at 230° C. for 1 hour) was not performed after the removal of the pillars.

Figure 19A:
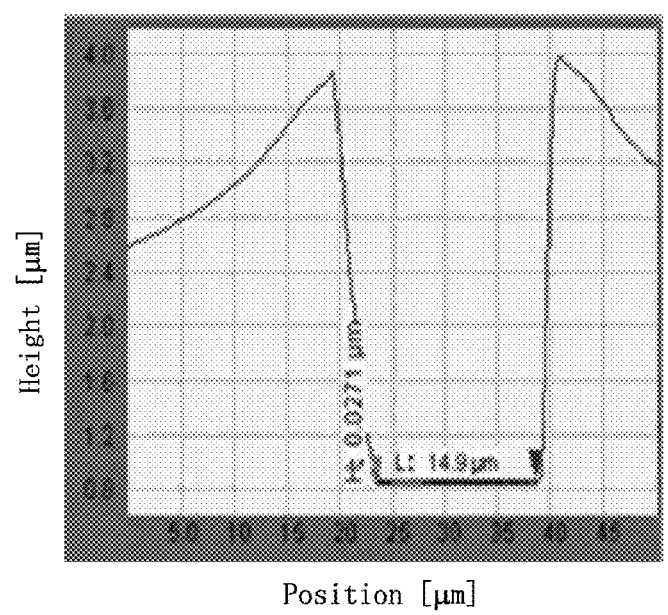
FIG. 19A is a graph indicating a cross-sectional shape of the opening formed after dipping in γ-butyrolactone in Comparative Example 1.
Figure 19B:
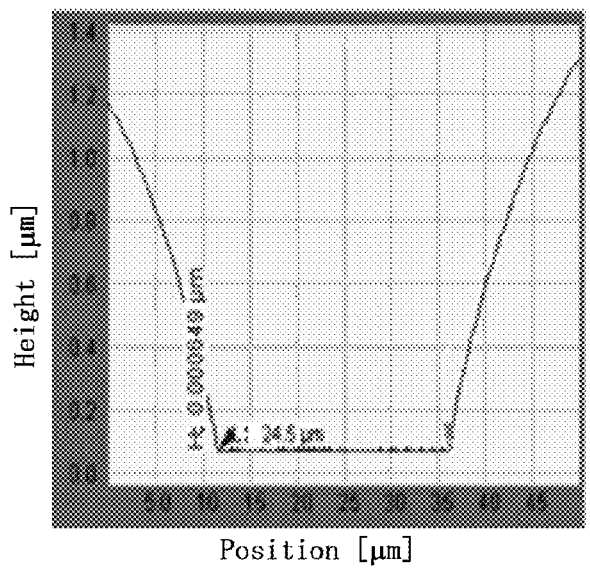
FIG. 19B is a graph indicating a cross-sectional shape of the via hole after curing of the insulating film in Example 1.
Figure 19C:
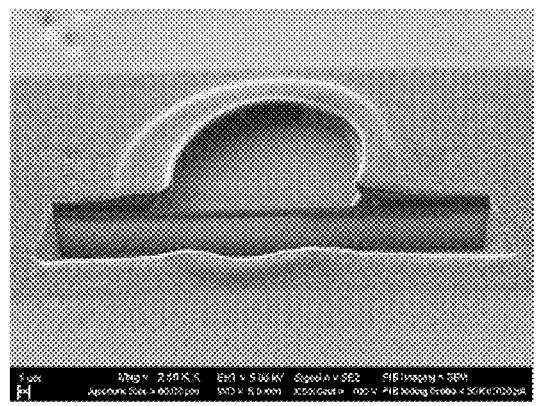
FIG. 19C is a SEM image of the opening formed after dipping in γ-butyrolactone in Comparative Example 1.
Figure 19D:
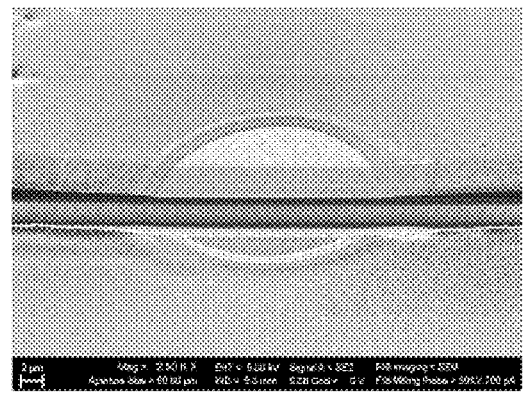
FIG. 19D is a SEM image of the via hole after curing of the insulating film in Example 1.

Here, FIG. 19A illustrates a cross-sectional shape of the opening formed after dipped in γ-butyrolactone in Comparative Example 1. FIG. 19B illustrates a cross-sectional shape of the via hole after the heat treatment of the insulating film 74 in Example 1. FIG. 19C illustrates the SEM observation result of the opening formed after dipping in γ-butyrolactone in Comparative Example 1. FIG. 19D illustrates the SEM observation result of the via hole after the heat treatment of the insulating film 74 in Example 1. Note that, the cross sectional shape was examined by AFM (product of Pacific Nanotechnology, Inc.) analysis.

In FIG. 19A, the thickness of the edge (rim) of the via hole is significantly thick. Moreover, it was found from the SEM viewing of FIG. 19C that the via hole of FIG. 19A was tapered to the top.

On the other hand, it was found that the via hole of FIG. 19B was gradually tapered to the bottom. This is probably because the shape of the via hole changed from the heat treatment performed on the insulating film 74 at 230° C. for 1 hour, to have taper towards the bottom. The tapered angle in FIG. 19B was appropriately 10°. Accordingly, disconnection of the upper electrode 75, or entry of air bubbles into the via hole could be prevented during the formation of the upper electrode 75.

Figure 20:
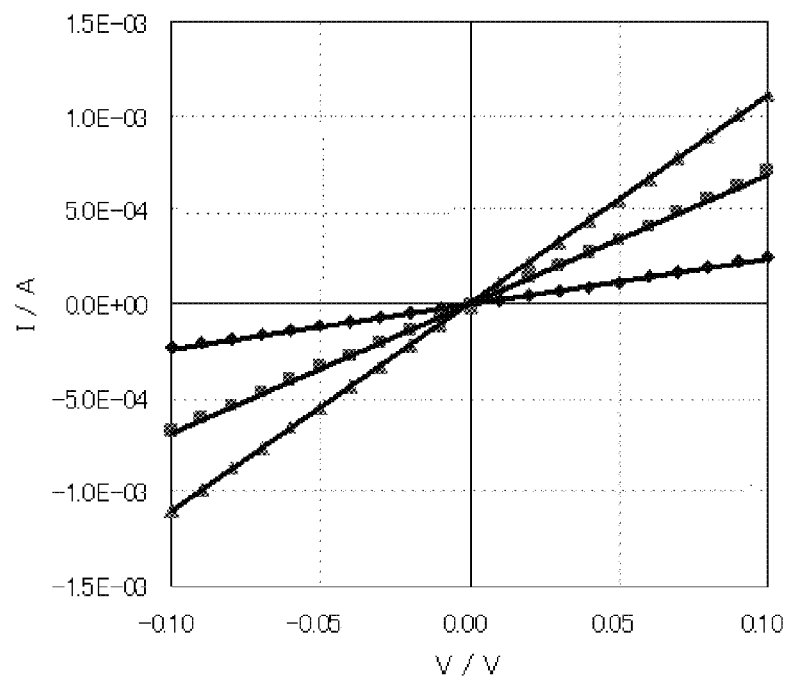
FIG. 20 is a graph of I-V characteristics of the upper electrode and the lower electrode of the multilayer wiring of Example 1.

Further, the I-V characteristics of the lower electrode 72 and the upper electrode 75 are depicted in FIG. 20. The numbers of via holes of the presented I-V curves are one, four, and nine, respectively. In FIG. 20, the I-V curve where the number of via holes is one is expressed by rhombic dots, the I-V curve where the number of via holes is four is expressed by square dots, and the I-V curve where the number of via holes is nine is expressed by triangular dots. Any of the curves showed an ohmic contact, and therefore it was found that the lower electrode 72 and the upper electrode 75 were electrically connected through the via hole.

Example 2

A multilayer wiring of Example 2 was formed in the same manner as in Example 1, provided that "Formation of Insulating Film" and "Heat Treatment" were changed as follows.
—Formation of Insulating Film—

As an insulating film-forming material, a thermosetting silicone resin in xylene serving as a solvent (product name: KR-271, product of Shin-Etsu Chemical Co., Ltd.) was provided. The amount of the thermosetting silicone resin in the insulating film-forming material was 50% by mass.

The insulating film-forming material was applied onto the glass substrate, on which the lower electrode and pillars had been formed, by spin coating (name of the apparatus used: 1X-DX2, product of Mikasa Co.), followed by drying at 65° C. for 30 minutes to thereby form an insulating film having the average thickness of 1 μm.
—Heat Treatment—

Next, the glass substrate with the insulating film in which the openings had been formed was heated from room temperature to 200° C. at a temperature increasing rate of 1° C./min using an oven (DTS82, product of YAMATO SCIENTIFIC CO., LTD.) and subjected to a heat treatment at 200° C. for 1 hour, to make the projected portion disappear to thereby form holes each tapering to the bottom.

Example 3

A multilayer wiring of Example 3 was formed in the same manner as in Example 1, provided that "Formation of Insulating Film" was changed as follows.

—Formation of Insulating Film—

As an insulating film-forming material, a thermosetting PDMS (polydimethylsiloxane) organic-inorganic hybrid resin in cyclohexane serving as a solvent was provided. The amount of the thermosetting PDMS organic-inorganic hybrid resin in the insulating film-forming material was 50% by mass.

The insulating film-forming material was applied by spin coating (name of the apparatus used: 1X-DX2, product of Mikasa Co.) onto the glass substrate on which the lower electrode and pillars had been formed, followed by drying at 65° C. for 30 minutes to thereby form an insulating film having the average thickness of 1 μm.

Example 4

A multilayer wiring of Example 4 was formed in the same manner as in Example 1, provided that "Formation of Pillars" was changed as follows.
—Formation of Pillars—

As a pillar forming liquid, a solution of a thermosetting polyimide resin (product name: YUPICOAT FS-100L, product of Ube Kosan Co., Ltd.) diluted with γ-butyrolactone was provided. The amount of the thermosetting polyimide in the pillar forming liquid was 30% by mass.

The pillar forming liquid (ink) was ejected onto the lower electrode by an inkjet device (product name: Super Inkjet Device, product of SIJ Technology, Inc.) in accordance with a droplet ejecting method (ejection conditions: voltage of 220 V, frequency of 100 Hz) to thereby form pillars having the maximum diameter of 15 μm, and the maximum height of 7 μm. After forming the pillars, they were dried at 65° C. for 30 minutes.

Example 5

A multilayer wiring of Example 5 was formed in the same manner as in Example 2, provided that "Formation of Pillars" was changed as follows.
—Formation of Pillars—

As a pillar forming liquid, a solution of a thermosetting polyimide resin (product name: YUPICOAT FS-100L, product of Ube Kosan Co., Ltd.) diluted with γ-butyrolactone was provided. The amount of the thermosetting polyimide in the pillar forming liquid was 30% by mass.

The pillar forming liquid (ink) was ejected onto the lower electrode by an inkjet device (product name: Super Inkjet Device, product of SIJ Technology, Inc.) in accordance with a droplet ejecting method (ejection conditions: voltage of 220 V, frequency of 100 Hz) to thereby form pillars having the maximum diameter of 15 μm, and the maximum height of 7 μm. After forming the pillars, they were dried at 65° C. for 30 minutes.

Example 6

A multilayer wiring of Example 6 was formed in the same manner as in Example 3, provided that "Formation of Pillars" was changed as follows.
—Formation of Pillars—

As a pillar forming liquid, a solution of a thermosetting polyimide resin (product name: YUPICOAT FS-100L, product of Ube Kosan Co., Ltd.) diluted with γ-butyrolactone was provided. The amount of the thermosetting polyimide in the pillar forming liquid was 30% by mass.

The pillar forming liquid (ink) was ed onto the lower electrode by an inkjet device (product name: Super Inkjet Device, product of SIJ Technology, Inc.) in accordance with a droplet ejecting method (ejection conditions: voltage of 220 V, frequency of 100 Hz) to thereby form pillars having the maximum diameter of 15 µm, and the maximum height of 7 µm. After forming the pillars, they were dried at 65° C. for 30 minutes.

Example 7

A multilayer wiring of Example 7 was formed in the same manner as in Example 1, provided that "Formation of Pillars," "Formation of Insulating Film," "Removal of Pillars," and "Heat Treatment" were changed as follows.
—Formation of Pillars—
As a pillar forming liquid, Ag nanoparticles (product name: NPS-J, product of Harima Chemicals, Inc., average particle diameter: 12 nm) in n-tetradecane serving as a solvent were provided. The amount of the Ag nanoparticles in the pillar forming liquid was 65% by mass.
The pillar forming liquid (ink) was ejected onto the lower electrode by an inkjet device (product name: Super Inkjet Device, product of SIJ Technology, Inc.) in accordance with a droplet ejecting method (ejection conditions: voltage of 400 V, frequency of 50 Hz), followed by subjected to a heat treatment at 180° C. for 30 minutes, to thereby form pillars having the maximum diameter of 15 µm, and the maximum height of 10 µm.
—Formation of Insulating Film—
As an insulating film-forming material, a thermosetting polyimide in γ-butyrolactone serving as a main solvent (product name: DL-1000, product of Toray Inc.) was provided.
The insulating film-forming material was applied onto the glass substrate, on which the lower electrode and pillars had been formed, by spin coating (name of the apparatus used: 1X-DX2, product of Mikasa Co.), followed by drying at 65° C. for 30 minutes to thereby form an insulating film having the average thickness of 1 µm.
—Removal of Pillars—
Next, the glass substrate on which the insulating film had been formed was immersed at room temperature for 5 minutes in Ag etching solution (product name: SEA-1, product of Kanto Chemical Co., Inc.) to remove pillars, to thereby form openings each having a projected portion along the periphery.
—Heat Treatment—
Next, the glass substrate with the insulating film in which the openings had been formed was heated from room temperature to 230° C. at a temperature increasing rate of 1° C./min using an oven (DTS82, product of YAMATO SCIENTIFIC CO., LTD.) and was subjected to a heat treatment at 230° C. for 1 hour, to make the projected portion disappear to thereby form holes each tapering to the bottom.

Example 8

A multilayer wiring of Example 8 was formed in the same manner as in Example 7, provided that "Formation of Insulating Film" was changed as follows.
—Formation of Insulating Film—
As an insulating film-forming material, a thermosetting acrylic resin in γ-butyrolactone serving as a solvent was provided. The amount of the thermoplastic acrylic resin in the insulating film-forming material was 30% by mass.
The insulating film-forming material was applied onto the glass substrate, on which the lower electrode and pillars had been formed, by spin coating (name of the apparatus used: 1X-DX2, product of Mikasa Co.), followed by drying at 65° C. for 30 minutes to thereby form an insulating film having the average thickness of 1 µm.

Example 9

A multilayer wiring of Example 9 was formed in the same manner as in Example 7, provided that "Formation of Insulating Film" was changed as follows.
—Formation of Insulating Film—
As an insulating film-forming material, a thermosetting epoxy resin in γ-butyrolactone serving as a solvent was provided. An amount of the thermosetting epoxy resin in the insulating film-forming material was 30% by mass.
The insulating film-forming material was applied onto the glass substrate, on which the lower electrode and pillars had been formed, by spin coating (name of the apparatus used: 1X-DX2, product of Mikasa Co.), followed by drying at 65° C. for 30 minutes to thereby form an insulating film having the average thickness of 1 µm.

Example 10

A multilayer wiring of Example 10 was formed in the same manner as in Example 7, provided that "Formation of Insulating Film" was changed as follows.
—Formation of Insulating Film—
As an insulating film-forming material, a thermoplastic fluororesin in perfluorotributylamine serving as a solvent (product name: CYTOP $(C_6F_{10}O)_n$, (n=about 80,000), product of Asahi Glass Co., Ltd.) was provided. The amount of the thermoplastic fluororesin in the insulating film-forming material was 9% by mass.
The insulating film-forming material was applied onto the glass substrate, on which the lower electrode and pillars had been formed, by spin coating (name of the apparatus used: 1X-DX2, product of Mikasa Co.), followed by drying at 65° C. for 30 minutes to thereby form an insulating film having the average thickness of 1 µm.

Example 11

A multilayer wiring of Example 11 was formed in the same manner as in Example 7, provided that "Formation of Insulating Film" and "Heat Treatment" were changed as follows.
—Formation of Insulating Film—
As an insulating film-forming material, a thermosetting silicone resin in xylene serving as a solvent (product name: KR-271, product of Shin-Etsu Chemical Co., Ltd.) was provided. The amount of the thermosetting silicone resin in the insulating film-forming material was 50% by mass.
The insulating film-forming material was applied onto the glass substrate, on which the lower electrode and pillars had been formed, by spin coating (name of the apparatus used: 1X-DX2, product of Mikasa Co.), followed by drying at 65° C. for 30 minutes to thereby form an insulating film having the average thickness of 1 µm.
—Heat Treatment—
Next, the glass substrate with the insulating film in which the openings had been formed was heated from room temperature to 200° C. at a temperature increasing rate of 1° C./min using an oven (DTS82, product of YAMATO SCIENTIFIC CO., LTD.) and was subjected to a heat treatment at 200° C. for 1 hour, to make the projected portion disappear to thereby form holes each tapering to the bottom.

Example 12

A multilayer wiring of Example 12 was formed in the same manner as in Example 7, provided that "Formation of Insulating Film" and "Heat Treatment" were changed as follows.

—Formation of Insulating Film—

As an insulating film-forming material, a thermosetting PDMS (polydimethylsiloxane) organic-inorganic hybrid resin in cyclohexane serving as a solvent was provided. An amount of the thermosetting PDMS organic-inorganic hybrid resin in the obtained insulating film-forming material was 50% by mass.

The insulating film-forming material was applied by spin coating (name of the apparatus used: 1X-DX2, product of Mikasa Co.) onto the glass substrate on which the lower electrode and pillars had been formed, followed by drying at 65° C. for 30 minutes to thereby form an insulating film having the average thickness of 1 µm.

—Heat Treatment—

The glass substrate with the insulating film in which the openings had been formed was heated from room temperature to 200° C. at a temperature increasing rate of 1° C./min using an oven (DTS82, product of YAMATO SCIENTIFIC CO., LTD.) and was subjected to a heat treatment at 200° C. for 1 hour, to make the projected portion disappear to thereby form holes each tapering to the bottom.

Example 13

A multilayer wiring of Example 13 was formed in the same manner as in Example 7, provided that "Formation of Insulating Film" and "Heat Treatment" were changed as follows.

—Formation of Insulating Film—

As an insulating film-forming material, an organic-inorganic hybrid material in an alcohol serving as a solvent (product name: GLASKA, product of JSR) was provided.

The insulating film-forming material was applied by spin coating (name of the apparatus used: 1X-DX2, product of Mikasa Co.) onto the glass substrate on which the lower electrode and pillars had been formed, followed by drying at 65° C. for 30 minutes to thereby form an insulating film having the average thickness of 1 µm.

Example 14

A multilayer wiring of Example 14 was formed in the same manner as in Example 7, provided that "Formation of Pillars," "Formation of Insulating Film," and "Removal of Pillars" and "Heat Treatment" were changed as follows.

—Formation of Pillars—

As a pillar forming liquid, Ag nanoparticles (product name: NPS-J, product of Harima Chemicals, Inc., average particle diameter: 12 nm) in n-tetradecane serving as a solvent were prepared. The amount of the Ag nanoparticles in the pillar forming liquid was 65% by mass.

The pillar forming liquid (ink) was ejected onto the lower electrode by an inkjet device (product name: Super Inkjet Device, product of SIJ Technology, Inc.) in accordance with a droplet ejecting method (ejection conditions: voltage of 400 V, frequency of 50 Hz), followed by heat treating at 180° C. for 30 minutes, to thereby form pillars having the maximum diameter of 15 µm, and the maximum height of 5 µm.

—Formation of Insulating Film—

As an insulating film-forming material, a spin-on-glass material in methyl isobutyl ketone serving as a solvent (product name: FOX (R)-16, product of Dow Corning Toray Co., Ltd.) was provided. The amount of the spin-on-glass material in the insulating film-forming material was 20% by mass.

The insulating film-forming material was applied by spin coating (name of the apparatus used: 1X-DX2, product of Mikasa Co.) onto the glass substrate on which the lower electrode and pillars had been formed, followed by drying at 65° C. for 30 minutes to thereby form an insulating film having the average thickness of 500 nm.

—Heat Treatment—

Next, the glass substrate with the insulating film in which the opening had been formed was heated from room temperature to 450° C. at a temperature increasing rate of 5° C./min using an electric furnace (KDFOO8H, product of DENKEN CO., LTD.) and subjected to a heat treatment at 450° C. for 1 hour, to make the projected portion disappear to thereby form holes each tapering to the bottom.

Next, the multilayer wirings produced in Examples 1 to 14 and Comparative Example 1 were evaluated in terms of "the measurement of the maximum diameter of the via hole," "the measurement of the tapered angle of the via hole," "the measurement of the step coverage of the conductive material to the via hole," "the evaluation on the electric conduction ability of the multilayer wiring" and "the evaluation on the process reproducibility" in the following manner. The results are presented in Table 3.

<Measurement of the Maximum Diameter of the Via Hole>

The maximum diameter of the exposed edge of the opening of the via hole was measured by an optical microscope.

<Measurement of Tapered Angle of Via Hole>

The tapered angle of the via hole was measured by AFM (of Pacific Nanotechnology, Inc.).

<Evaluation on Step Coverage of Electrically Conductive Material to Via Hole>

The step coverage of the electrically conductive material to the via hole was observed by SEM cross section image, and evaluated based on the following criteria.

[Evaluation Criteria]

A: no disconnection was observed, and it was confirmed that the lower electrode and the upper electrode were connected B: disconnection was observed <Evaluation on Electric Conduction Ability>

The voltage of ±0.1 V was applied between the upper electrode and the lower electrode to measure the value of electric current using 4156C of Agilent, Inc. to evaluate the electric conduction ability, and the results were evaluated based on the following criteria.

[Evaluation Criteria]

A: The case when characteristics of ohmic contact were confirmed.

B: Any other cases

<Evaluation on Process Reproducibility>

The identical procedure of each Example or Comparative Example was performed 5 times, and reproducibility of the process was evaluated. The case where holes were formed in every procedure or the maximum diameter of the obtained holes was 30 µm or smaller, it was judged as "A," and other cases were judged as "B."

TABLE 2-1

| | Pillar | | |
|---|---|---|---|
| | Solvent | Material (drying conditions) | Pillar maximum height |
| Ex. 1 | γ-butyrolactone | thermoplastic acrylic resin (65° C., 30 min.) | 7 µm |
| Ex. 2 | γ-butyrolactone | thermoplastic acrylic resin (65° C., 30 min.) | 7 µm |
| Ex. 3 | γ-butyrolactone | thermoplastic acrylic resin (65° C., 30 min.) | 7 µm |
| Ex. 4 | γ-butyrolactone | thermosetting polyimide (65° C., 30 min.) | 7 µm |

TABLE 2-1-continued

| | Pillar | | |
|---|---|---|---|
| | Solvent | Material (drying conditions) | Pillar maximum height |
| Ex. 5 | γ-butyrolactone | thermosetting polyimide (65° C., 30 min.) | 7 μm |
| Ex. 6 | γ-butyrolactone | thermosetting polyimide (65° C., 30 min.) | 7 μm |
| Ex. 7 | n-tetradecane | Ag nanoparticles (180° C., 30 min.) | 10 μm |
| Ex. 8 | n-tetradecane | Ag nanoparticles (180° C., 30 min.) | 10 μm |
| Ex. 9 | n-tetradecane | Ag nanoparticles (180° C., 30 min.) | 10 μm |
| Ex. 10 | n-tetradecane | Ag nanoparticles (180° C., 30 min.) | 10 μm |
| Ex. 11 | n-tetradecane | Ag nanoparticles (180° C., 30 min.) | 10 μm |
| Ex. 12 | n-tetradecane | Ag nanoparticles (180° C., 30 min.) | 10 μm |
| Ex. 13 | n-tetradecane | Ag nanoparticles (180° C., 30 min.) | 10 μm |
| Ex. 14 | n-tetradecane | Ag nanoparticles (180° C., 30 min.) | 5 μm |
| Comp. Ex. 1 | γ-butyrolactone | thermoplastic acrylic resin (65° C., 30 min.) | 7 μm |

TABLE 2-2

| | Insulating film | | |
|---|---|---|---|
| | Solvent | Material (drying conditions) | Avg. film thickness |
| Ex. 1 | perfluorotri-butylamine | thermoplastic fluororesin (CYTOP, Asahi Glass) (65° C., 30 min) | 1 μm |
| Ex. 2 | xylene | thermosetting silicone resin (65° C., 30 min.) | 1 μm |
| Ex. 3 | cyclohexane | thermosetting PDMS organic-inorganic hybrid (65° C., 30 min.) | 1 μm |
| Ex. 4 | perfluorotri-butylamine | thermoplastic fluororesin (CYTOP, Asahi Glass) (65° C., 30 min) | 1 μm |
| Ex. 5 | xylene | thermosetting silicone resin (65° C., 30 min.) | 1 μm |
| Ex. 6 | cyclohexane | thermosetting PDMS organic-inorganic hybrid (65° C., 30 min.) | 1 μm |
| Ex. 7 | γ-butyrolactone | thermosetting polyimide resin (65° C., 30 min) | 1 μm |
| Ex. 8 | γ-butyrolactone | thermosetting acrylic resin (65° C., 30 min) | 1 μm |
| Ex. 9 | γ-butyrolactone | thermosetting epoxy resin (65° C., 30 min) | 1 μm |
| Ex. 10 | perfluorotri-butylamine | thermoplastic fluororesin (CYTOP, Asahi Glass) (65° C., 30 min) | 1 μm |
| Ex. 11 | xylene | thermosetting silicone resin (65° C., 30 min) | 1 μm |
| Ex. 12 | cyclohexane | thermosetting PDMS organic-inorganic hybrid (65° C., 30 min) | 1 μm |
| Ex. 13 | alcohol | organic-inorganic hybrid material (GLASKA, product of JSR) (65° C., 30 min) | 1 μm |
| Ex. 14 | methyl isobutyl ketone | spin-on-glass material (FOX (R)-16, product of Dow Corning Toray Co., Ltd.) (65° C., 30 min) | 500 nm |
| Comp. Ex. 1 | perfluorotri-butylamine | thermoplastic fluororesin (CYTOP, Asahi Glass) (65° C., 30 min) | 1 μm |

TABLE 2-3

| | Pillar removing liquid | Heat treatment conditions |
|---|---|---|
| Ex. 1 | γ-butyrolactone | 230° C. for 1 h (heated from rt at 1° C./min.) |
| Ex. 2 | γ-butyrolactone | 200° C. for 1 h (heated from rt at 1° C./min.) |
| Ex. 3 | γ-butyrolactone | 200° C. for 1 h (heated from rt at 1° C./min.) |
| Ex. 4 | γ-butyrolactone | 230° C. for 1 h (heated from rt at 1° C./min.) |
| Ex. 5 | γ-butyrolactone | 200° C. for 1 h (heated from rt at 1° C./min.) |
| Ex. 6 | γ-butyrolactone | 200° C. for 1 h (heated from rt at 1° C./min.) |
| Ex. 7 | Ag etching solution (SEA-1, Kanto Chemical) | 230° C. for 1 h (heated from rt at 1° C./min.) |
| Ex. 8 | Ag etching solution (SEA-1, Kanto Chemical) | 230° C. for 1 h (heated from rt at 1° C./min.) |
| Ex. 9 | Ag etching solution (SEA-1, Kanto Chemical) | 230° C. for 1 h (heated from rt at 1° C./min.) |
| Ex. 10 | Ag etching solution (SEA-1, Kanto Chemical) | 230° C. for 1 h (heated from rt at 1° C./min.) |
| Ex. 11 | Ag etching solution (SEA-1, Kanto Chemical) | 200° C. for 1 h (heated from rt at 1° C./min.) |
| Ex. 12 | Ag etching solution (SEA-1, Kanto Chemical) | 200° C. for 1 h (heated from rt at 1° C./min.) |
| Ex. 13 | Ag etching solution (SEA-1, Kanto Chemical) | 200° C. for 1 h (heated from rt at 1° C./min.) |
| Ex. 14 | Ag etching solution (SEA-1, Kanto Chemical) | 450° C. for 1 h (heated from rt at 5° C./min.) |
| Comp. Ex. 1 | γ-butyrolactone | — |

TABLE 3

| | Opening diameter of via hole (μm) | Tapered angle of via hole (°) | Step coverage | Electrical conductivity | Reproducibility |
|---|---|---|---|---|---|
| Example 1 | 15 | 10 | A | A | A |
| Example 2 | 20 | 15 | A | A | A |
| Example 3 | 18 | 10 | A | A | A |
| Example 4 | 20 | 10 | A | A | A |
| Example 5 | 18 | 15 | A | A | A |
| Example 6 | 17 | 15 | A | A | A |
| Example 7 | 15 | 25 | A | A | A |
| Example 8 | 10 | 20 | A | A | A |
| Example 9 | 12 | 25 | A | A | A |
| Example 10 | 15 | 25 | A | A | A |
| Example 11 | 12 | 15 | A | A | A |
| Example 12 | 20 | 15 | A | A | A |
| Example 13 | 15 | 10 | A | A | A |
| Example 14 | 15 | 15 | A | A | A |
| Comparative Example 1 | 15 | NA | B | B | — |

In Table 3, the data of the tapered angle of the via hole in the multilayer wiring of Comparative Example 1 is not available (NA), because the via hole thereof was tapered to the top (others were to the bottom) and therefore it could not be measured.

Example 15

Example 15 will be specifically explained through FIGS. 2A to 2E.

First, UV ozone washing was performed on a glass substrate 11 having a thickness of 0.7 mm as a pretreatment. For the UV ozone washing, a low pressure mercury lamp was used as a UV lamp, and the treatment was performed at 90° C. for 10 minutes.

Next, a first source electrode 12, a first drain electrode 13, a second source electrode 14, and a second drain electrode 15 were formed on a glass substrate 11 (FIG. 2A).

Specifically, an electrically conductive oxide tin film of ITO was formed on the glass substrate 11 by DC sputtering (name of the apparatus used: i-Miller, product of SHIBAURA MECHATRONICS CORPORATION) at room temperature to give a thickness of 100 nm.

Next, a photoresist was applied onto the electrically conductive oxide film formed of ITO by spin coating (name of the apparatus used: 1X-DX2, product of Mikasa Co.), followed by performing prebaking at 90° C. for 30 minutes. Subsequently, the photoresist was exposed to g-, h-, i-mixed UV rays through a photomask at 150 mJ/cm$^2$, and then the exposed photoresist was developed with a developer NMD-W2.38, product of Tokyo Ohka Kogyo Co., Ltd., followed by subjected to postbaking at 120° C. for 30 minutes, to thereby form a photoresist pattern. Thereafter, the region of the ITO film on which the resist pattern had not been formed was removed by reactive ion etching (RIE), and then the resist pattern was removed (FIG. 2A). Then, the resultant was further subjected to a heat treatment at 250° C. for 30 minutes. In the manner as mentioned, a first source electrode 12, a first drain electrode 13, a second source electrode 14, and a second drain electrode 15 were formed.

Next, first and second semiconductive layers 16, 17 were formed (FIG. 2A).

Specifically, an In—Ga—Zn—O oxide film was formed by DC sputtering to give a thickness of about 100 nm. A photoresist was then applied onto the In—Ga—Zn—O oxide film, and a resist pattern was formed after going through processes of prebaking, exposure by an exposure device, and developing. Then, the region of the In—Ga—Zn—O oxide film on which the resist pattern had not been formed was removed by RIE, followed by removing the resist pattern, to thereby form first and second semiconductive layers 16, 17.

Next, a gate insulating film 18, in which a via hole was formed, was formed on the first drain electrode 13 (FIGS. 2B to 2D).

—Formation of Pillar—

As a pillar forming liquid, a solution of a thermoplastic acrylic resin (product name: KH-CT-865, product of Hitachi Chemical Co., Ltd.) diluted with γ-butyrolactone was provided. The amount of the thermoplastic acrylic resin in the pillar forming liquid was 25% by mass.

Specifically, the pillar forming liquid (ink) was ejected by an inkjet device (product name: Super Inkjet Device, product of SIJ Technology, Inc.) in accordance with a droplet ejecting method to thereby form a pillar 19 having the maximum diameter of 15 μm, and the maximum height of 5 μm (FIG. 2A). After forming the pillar 19, it was dried at 65° C. for 30 minutes.

—Formation of Insulating Film—

As an insulating film-forming material, a thermoplastic fluororesin in perfluorotributylamine serving as a solvent (CYTOP, product of Asahi Glass Co., Ltd., $(C6F_{10}O)_n$ (n=about 80,000)) was provided. The amount of the thermoplastic fluororesin in the insulating film-forming material was 9% by mass.

The insulating film-forming material was applied onto the glass substrate 11 on which the pillar 19 had been formed by spin coating (name of the apparatus used: 1X-DX2, product of Mikasa Co.), followed by drying at 65° C. for 30 minutes to thereby form a gate insulating film 18 having a thickness of 500 nm (FIG. 2B).

—Removal of Pillar—

Next, the glass substrate 11 on which the gate insulating film 18 had been formed was dipped into γ-butyrolactone for 5 minutes at room temperature to dissolve and remove the pillar 19, to thereby form an opening having a projected portion along the rim (FIG. 2C).

—Heat Treatment—

The glass substrate with the insulating film in which the opening had been formed was heated from room temperature to 230° C. at a temperature increasing rate of 1° C./min using an oven (DTS82, product of YAMATO SCIENTIFIC CO., LTD.) and subjected to a heat treatment at 230° C. for 1 hour to thereby make the projected portion disappear. As a result, a hole tapering to the bottom was formed (FIG. 2D).

Next, ashing was performed with Ar plasma to remove any residues. The conditions for the ashing were the Ar flow rate of 50 sccm, the pressure of 35 Pa, powder of 500 W, and processing duration of 30 seconds.

Next, first and second gate electrodes 20, 21 were formed to thereby form a semiconductor device 10 (FIG. 2E).

Specifically, a film of molybdenum (Mo) was formed on the glass substrate 11, on which the gate insulating film 18 had been formed and cured, by DC sputtering under normal temperature to give a thickness of 100 nm. Subsequently, a photoresist was applied onto the Mo film, and a resist pattern was formed after going through the processes of prebaking, exposure by an exposure device, and developing. Then, the region of the Mo film on which the resist pattern had not been formed was removed by reactive ion etching (RIE), followed by removing the resist pattern.

In the manner as mentioned above, a semiconductor device of a two-transistor one-capacitor structure, in which the first drain electrode 13 and the second gate electrode 21 were electrically connected through the via-hole, and moreover a capacitor was formed between the second gate electrode and the second source electrode, was obtained.

Next, the two-transistor one-capacitor structure semiconductor device of Example 15 was evaluated in terms of "the measurement of the maximum diameter of the via hole," "the measurement of the tapered angle of the via hole," "the measurement of the step coverage of the conductive material to the via hole," "the evaluation on the electric conduction ability of the multilayer wiring" and "the evaluation on the process reproducibility" in the same manner as in Example 1. The results are presented in Table 4.

Example 16

Example 16 will be specifically explained with reference to FIGS. 7A to 7G.

First, UV ozone washing was performed on a glass substrate 31 having a thickness of 0.7 mm as a pretreatment. For the UV ozone washing, a low pressure mercury lamp was used as a UV lamp, and the treatment was performed at 90° C. for 10 minutes.

Next, a first source electrode 32, a first drain electrode 33, a second source electrode 34, and a second drain electrode 35 were formed on the glass substrate 31 (FIG. 7A).

Specifically, an electrically conductive oxide tin film of ITO was formed on the glass substrate 31 by DC sputtering (name of the apparatus used: i-Miller, product of SHIBAURA MECHATRONICS CORPORATION) at ambient temperature to have a thickness of 100 nm.

Next, a photoresist was applied onto the electrically conductive oxide film formed of ITO by spin coating, followed by performing prebaking at 90° C. for 30 minutes. Subsequently, the photoresist was exposed to g-, h-, i-mixed UV rays through a photomask at 150 mJ/cm$^2$, and then the exposed photoresist was developed with a developer NMD-W2.38, product of Tokyo Ohka Kogyo Co., Ltd., followed by subjected to postbaking at 120° C. for 30 minutes, to thereby form a photoresist pattern. Thereafter, the region of the ITO film on which the resist pattern had not been formed was removed by reactive ion etching (RIE), and then the resist pattern was removed (FIG. 7A). Then, the resultant was further subjected to a heat treatment at 250° C. for 30 minutes. In the manner as mentioned, a first source electrode 32, a first drain electrode 33, a second source electrode 34, and a second drain electrode 35 were formed.

Next, first and second semiconductive layers 36, 37 were formed (FIG. 7A).

Specifically, an In—Ga—Zn—O oxide film was formed by DC sputtering to give a thickness of about 100 nm. A photoresist was then applied onto the In—Ga—Zn—O oxide film, and a resist pattern was formed after going through processes of prebaking, exposure by an exposure device, and developing. Then, the region of the In—Ga—Zn—O oxide film on which the resist pattern had not been formed was removed by RIE, followed by removing the resist pattern, to thereby form first and second semiconductive layers 36, 37 (FIG. 7A).

Next, a gate insulating film 18, in which via holes were formed, was formed on the first and second drain electrodes 33, 35 (FIGS. 7B to 7D).

—Formation of Pillars—

As a pillar forming liquid, a thermoplastic acrylic resin (product name: KH-CT-865, product of Hitachi Chemical Co., Ltd.) diluted with γ-butyrolactone was provided. The amount of the thermoplastic acrylic resin in the pillar forming liquid was 25% by mass.

Specifically, the pillar forming liquid (ink) was ejected onto the first and second drain electrodes 33, 35 by an inkjet device (product name: Super Inkjet Device, product of SIJ Technology, Inc.) in accordance with a droplet ejecting method to thereby form pillars 39, 40 having the maximum diameter of 15 μm, and the maximum height of 5 μm (FIG. 7A). After forming the pillars 39, 40, they were dried at 65° C. for 30 minutes.

—Formation of Insulating Film—

As an insulating film-forming material, a thermoplastic fluororesin in perfluorotributylamine serving as a solvent (CYTOP, product of Asahi Glass Co., Ltd., $(C_6F_{10}O)_n$ (n=about 80,000)) was provided. The amount of the thermoplastic fluororesin in the insulating film-forming material was 9% by mass. The insulating film-forming material was applied onto the glass substrate 31 on which the pillars 39, 40 had been formed by spin coating (name of the apparatus used: 1X-DX2, product of Mikasa Co.), followed by drying at 65° C. for 30 minutes to thereby form a gate insulating film 38 having the average thickness of 500 nm (FIG. 7B).

—Removal of Pillars—

Next, the glass substrate 31 on which the gate insulating film 38 had been formed was dipped into γ-butyrolactone for 5 minutes at room temperature to dissolve and remove the pillar 39, 40, to thereby form openings each having a projected portion along the rim (FIG. 7C).

—Heat Treatment—

The glass substrate with the insulating film in which the opening had been formed was heated from room temperature to 230° C. at a temperature increasing rate of 1° C./min using an oven (DTS82, product of YAMATO SCIENTIFIC CO., LTD.) and was subjected to a heat treatment at 230° C. for 1 hour to cure the gate insulating film 38 to thereby make the projected portion disappear. As a result, holes each tapering to the bottom were formed (FIG. 7D).

Next, ashing was performed with Ar plasma to remove any residues. The conditions for the ashing were the Ar flow rate of 50 sccm, the pressure of 35 Pa, powder of 500 W, and processing duration of 30 seconds.

Next, first and second gate electrodes 41, 42, and a pixel electrode (anode) 43 were formed (FIG. 7E).

Specifically, an electrically conductive oxide tin film of ITO was formed on the glass substrate 31, on which the gate insulating film 38 had been formed and cured, by DC sputtering under room temperature to give a thickness of 100 nm. A photoresist was applied onto the electrically conductive film of ITO, and a resist pattern was formed after going through the processes of prebaking, exposure by an exposure device, and developing. Then, the region of the ITO film on which the resist pattern had not been formed was removed by reactive ion etching (RIE), followed by removing the resist pattern.

Next, a barrier 44 was formed. Specifically, a positive photosensitive polyimide was applied by spin coating, and the applied photosensitive polyimide was prebaked, exposed to light by an exposure device, and developed to thereby form a predetermined pattern. Thereafter, the obtained pattern was subjected to postbaking at 230° C. to thereby form a barrier 44 (FIG. 7F).

Next, a high polymer organic luminescent material was applied by a droplet ejection method to form, as a display layer, an organic EL layer 45 in the open region formed by the barrier 44.

Next, an upper electrode (cathode) 46 was formed. Specifically, the upper electrode (cathode) 46 was formed by vacuum vapor deposition of MgAg (FIG. 7G).

In the manner as mentioned above, an organic EL display element 30 was formed, which realized reduction in the production cost.

Next, the organic EL display element of Example 16 was evaluated in terms of "the measurement of the maximum diameter of the via hole," "the measurement of the tapered angle of the via hole," "the measurement of the step coverage of the conductive material to the via hole," "the evaluation on the electric conduction ability of the multilayer wiring" and "the evaluation on the process reproducibility" in the same manner as in Example 1. The results are presented in Table 4.

Example 17

Example 17 will be specifically explained with reference to FIGS. 21A to 21F.

UV ozone washing was performed on a glass substrate 81 having a thickness of 0.7 mm as a pretreatment. For the UV ozone washing, a low pressure mercury lamp was used as a UV lamp, and the treatment was performed at 90° C. for 10 minutes.

Next, first and second gate electrodes 82, 83 were formed on the glass substrate 81. Specifically, an ITO film, which was a transparent electrically conductive film, was formed on the glass substrate 81 by DC sputtering (name of the apparatus used: i-Miller, product of SHIBAURA MECHATRONICS CORPORATION) to give a thickness of about 100 nm. Thereafter, a photoresist was applied onto the ITO film, and a resist pattern, which had the same pattern to that of the first and second electrode 82, 83 to be formed, was formed after going through processes of prebaking, exposure by an exposure device, and developing. Then, the region of the ITO film, on which the resist pattern had not been formed, was removed by reactive ion etching (RIE), followed by removing the resist pattern, to thereby form the first and second gate electrodes 82, 83 (see FIG. 21A).

Next, a gate insulating layer 84 was formed. Specifically, a SiO$_2$ film was formed on the first and second electrodes 82, 83 and the glass substrate 81 by RF sputtering to give a thickness of about 300 nm. Thereafter, a photoresist was applied onto the SiO$_2$ film, and a resist pattern, which has the same pattern as that of the gate insulating layer 84 to be formed, was formed after going through processes of prebaking, exposure by an exposure device, and developing. The region of the SiO$_2$ film, on which the resist pattern had not been formed, was removed by reactive ion etching (RIE), followed by removing the resist pattern, to thereby form the gate insulating layer 84 (see FIG. 21A).

Next, first and second source electrodes 85, 86, and first and second drain electrodes 87, 88 were formed. Specifically, an ITO film, which was a transparent electrically conductive film, was formed on the gate insulating layer 84 to give a thickness of about 100 nm. Thereafter, a photoresist was applied onto the ITO film, and a resist pattern, which had the same pattern to that of the first and second source electrodes 85, 86 and first and second drain electrodes 87, 88 to be formed, was formed after going through processes of prebaking, exposure by an exposure device, and developing. Then, the region of the ITO film, on which the resist pattern had not bee formed, was removed by RIE, followed by removing the resist pattern, to thereby form the first and second source electrodes 85, 86, and first and second drain electrodes 87, 88, each formed of the ITO film (see FIG. 21A).

Next, first and second semiconductive layers 89, 90 were formed. Specifically, an Mg—In oxide film was formed by DC sputtering to give a thickness of about 100 nm. Thereafter, a photoresist was applied onto the Mg—In oxide film, and a resist pattern, which had the same pattern to that of the first and second conductive layers 89, 90 to be formed, was formed after going through processes of prebaking, exposure by an exposure device, and developing. The region of the Mg—In oxide film, on which the resist pattern had not been formed, was removed by RIE, followed by removing the resist pattern, to thereby form the first and second semiconductive layers 89, 90. As a result, the first semiconductive layer 89 was formed to thereby form a channel between the first source electrode 85 and the first drain electrode 87, and the second semiconductive layer 90 was formed to thereby form a channel between the second source electrode 86 and the second drain electrode 88 (see FIG. 21A).

Next, an interlayer insulating film 92, in which a via hole was formed, was formed on the drain electrode 88 (FIGS. 21B to 21E).

—Formation of Pillar—

As a pillar forming liquid, a solution of a thermoplastic acrylic resin (product name: KH-CT-865, product of Hitachi Chemical Co., Ltd.) diluted with γ-butyrolactone was provided. The amount of the thermoplastic acrylic resin in the pillar forming liquid was 25% by mass.

Figure 21A:
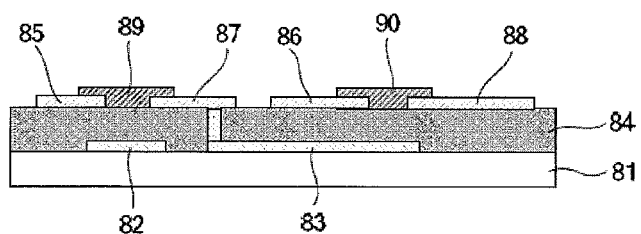
FIG. 21A illustrates a method for producing an organic EL display element in Example 17 (part 1).
Figure 21B:
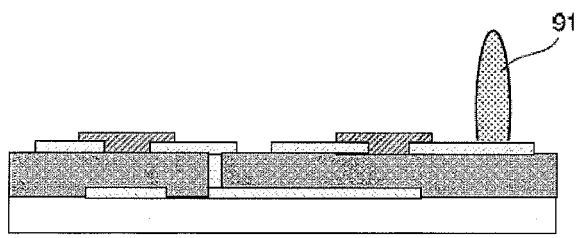
FIG. 21B illustrates a method for producing an organic EL display element in Example 17 (part 2).

Specifically, the pillar forming liquid (ink) was ejected by an inkjet device (product name: Super Inkjet Device, product of SIJ Technology, Inc.) in accordance with a droplet ejecting method to thereby form a pillar 91 having the maximum diameter of 15 μm, and the maximum height of 10 μm (FIG. 21B). After forming the pillar 91, it was dried at 65° C. for 30 minutes (FIG. 21B).

—Formation of Insulating Film—

Figure 21C:
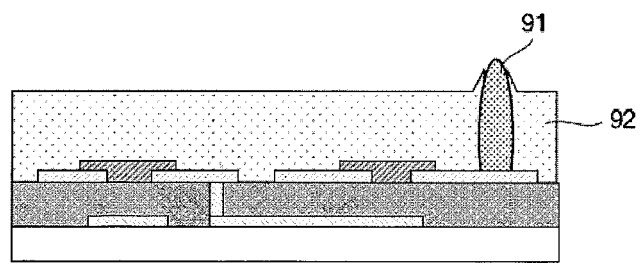
FIG. 21C illustrates a method for producing an organic EL display element in Example 17 (part 3).

As an insulating film-forming material, a thermoplastic fluororesin in perfluorotributylamine serving as a solvent (CYTOP, product of Asahi Glass Co., Ltd., $(C_6F_{10}O)_n$ (n=about 80,000)) was provided. The amount of the thermoplastic fluororesin in the insulating film-forming material was 9% by mass. The insulating film-forming material was applied onto the glass substrate 81, on which the pillar 91 had been formed, by spin coating (name of the apparatus used: 1X-DX2, product of Mikasa Co.), followed by drying at 65° C. for 30 minutes to thereby form an interlayer insulating film 92 having the average thickness of 1.5 μm (FIG. 21C).

—Removal of Pillar—

Figure 21D:
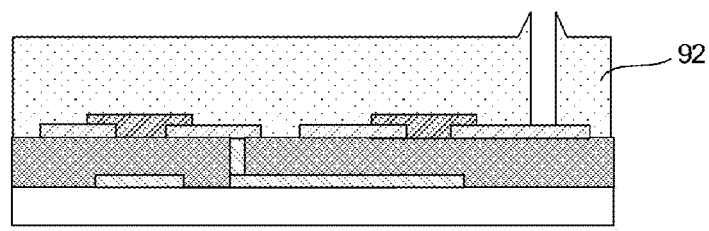
FIG. 21D illustrates a method for producing an organic EL display element in Example 17 (part 4).

Next, the glass substrate 81 on which the interlayer insulating film 92 had been formed was dipped into γ-butyrolactone for 5 minutes at room temperature to dissolve and remove the pillar 91, to thereby form an opening having a projected portion along the rim (FIG. 21D).

—Heat Treatment—

Figure 21E:
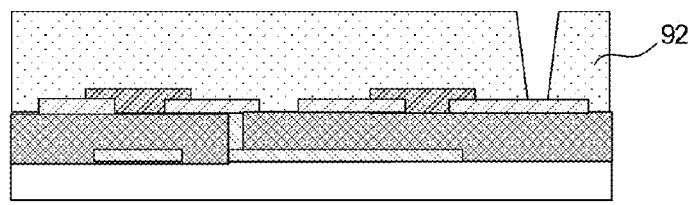
FIG. 21E illustrates a method for producing an organic EL display element in Example 17 (part 5).

The glass substrate with the insulating film in which the opening had been formed was heated from room temperature to 230° C. at a temperature increasing rate of 1° C./min using an oven (DTS82, product of YAMATO SCIENTIFIC CO., LTD.) and was subjected to a heat treatment at 230° C. for 1 hour to cure the interlayer insulating film 92 to thereby make the projected portion disappear. As a result, a hole tapering to the bottom was formed (FIG. 21E).

Next, ashing was performed with Ar plasma to remove any residues. The conditions for the ashing were the Ar flow rate of 50 sccm, the pressure of 35 Pa, powder of 500 W, and processing duration of 30 seconds.

Next, an ITO thin film was formed by DC sputtering, followed by applying a photoresist onto the ITO thin film by spin coating (name of the apparatus used: 1X-DX2, product of Mikasa Co.). Then, the resultant was subjected to prebaking at 90° C. for 30 minutes. Subsequently, the photoresist was exposed to g-, h-, i-mixed UV rays through a photomask at 150 mJ/cm$^2$, and then the exposed photoresist was developed with a developer NMD-W2.38, product of Tokyo Ohka Kogyo Co., Ltd., followed by subjected to postbaking at 120° C. for 30 minutes, to thereby form a photoresist pattern.

Figure 21F:
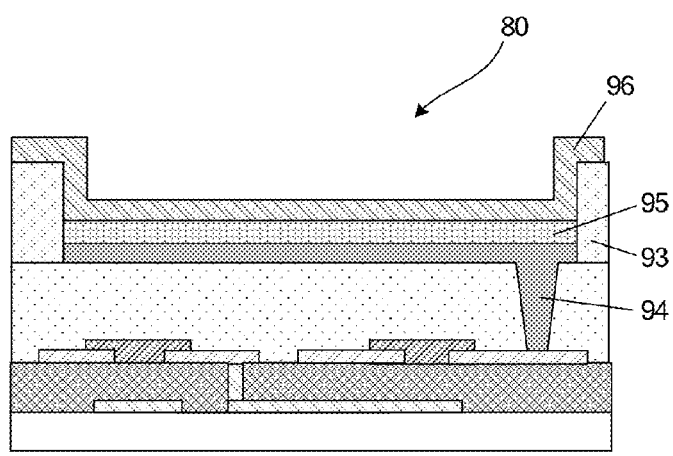
FIG. 21F illustrates a method for producing an organic EL display element in Example 17 (part 6).

The region of the ITO thin film, on which the resist pattern had not been formed, was removed by reactive ion etching (RIE), followed by removing the resist pattern, to thereby form an anode 94 (FIG. 21F).

Next, a barrier 93 was formed. Specifically, specifically, a positive photosensitive polyimide was applied by spin coating, and the applied photosensitive polyimide was prebaked, exposed to light by an exposure device, and developed to thereby form a predetermined pattern. Thereafter, the obtained pattern was subjected to postbaking at 230° C. to thereby form the barrier 93 (FIG. 21F).

Next, a high polymer organic luminescent material was applied by a droplet ejection method to form, as a display layer, an organic EL layer 95 in the open region formed by the barrier 93 (FIG. 21F).

Next, a cathode 96 was formed. Specifically, the cathode 96 was formed by vacuum vapor deposition of MgAg (FIG. 21F).

In the manner as mentioned above, an organic EL display element 80 was formed, which realized reduction in the production cost.

Next, the organic EL display element of Example 17 was evaluated in terms of "the measurement of the maximum diameter of the via hole," "the measurement of the tapered angle of the via hole," "the measurement of the step coverage of the conductive material to the via hole," "the evaluation on the electric conduction ability of the multilayer wiring" and "the evaluation on the process reproducibility" in the same manner as in Example 1. The results are presented in Table 4.

TABLE 4

| | Opening diameter of via hole (μm) | Tapered angle of via hole (°) | Step coverage | Electrical conductivity | Reproducibility |
|---|---|---|---|---|---|
| Ex. 15 | 20 | 15 | A | A | A |
| Ex. 16 | 15 | 10 | A | A | A |
| Ex. 17 | 15 | 15 | A | A | A |

The embodiments of the present invention are as follows.

<1> A hole formation method including:

applying a pillar-forming liquid to a base material, to thereby form a pillar;

applying an insulating film-forming material to the base material on which the pillar has been formed, to thereby form an insulating film;

removing the pillar to form an opening in the insulating film; and heat treating the insulating film in which the opening has been formed.

<2> The hole formation method according to <1>, wherein the pillar-forming liquid contains a resin and a solvent.

<3> The hole formation method according to <1>, wherein the pillar-forming liquid contains inorganic nanoparticles and a solvent.

<4> The hole formation method according to any one of <1> to <3>, wherein the applying the pillar-forming liquid is performed by an electrostatic attraction type inkjet method.

<5> The hole formation method according to any one of <1> to <4>, wherein the applying the insulating film-forming material is applying the insulating film-forming material to the entire surface of the base material.

<6> The hole formation method according to any one of <1> to <5>, wherein the applying the insulating film-forming material is applying the insulating film-forming material on the base material in a line-and-space pattern and making the insulating film-forming material spread over the entire surface of the base material using flowability of the insulating film-forming material.

<7> A multilayer wiring including:

a first wiring;

an insulating film covering the first wiring and containing a via hole; and a second wiring disposed on the insulating film, wherein the first wiring and the second wiring are connected together through the via hole of the insulating film, and where the via hole is formed by the hole formation method according to any one of <1> to <6>.

<8> A semiconductor device including:

at least one circuit containing at least two field effect transistors each containing: a substrate; a gate electrode for applying gate voltage; a source electrode and a drain electrode which are for extracting electric current; a semiconductive layer formed between the source electrode and the drain electrode; and a gate insulating film containing a via hole and formed between the gate electrode and the semiconductive layer, wherein the drain electrode of one of the field effect transistors is connected with the gate electrode of the other field effect transistor through the via hole of the gate insulating film, and wherein the via hole is formed by the hole formation method according to any one of <1> to <6>.

<9> A display element including:

a light control element which controls output of light based on drive signals; and a drive circuit which drives the light control element, wherein the drive circuit contains at least one circuit which contains at least two field effect transistors each containing: a substrate; a gate electrode for applying gate voltage; a source electrode and a drain electrode which are for extracting electrical current; a semiconductive layer formed between the source electrode and the drain electrode; and a gate insulating film containing a via hole and formed between the gate electrode and the semiconductive layer, wherein the drain electrode of one of the field effect transistors is connected with the gate electrode of the other field effect transistor through the via hole of the gate insulating film, and wherein the via hole is formed by the hole formation method according to any one of <1> to <6>.

<10> A display element including:

a light control element which controls output of light based on drive signals and contains an electrode;

a drive circuit which drives the light control element; and an interlayer insulating film containing a via hole and provided between the light control element and the drive circuit, wherein the drive circuit contains at least one field effect transistor containing: a substrate; a gate electrode for applying gate voltage; a source electrode and a drain electrode which are for extracting electrical current; a semiconductive layer formed between the source electrode and the drain electrode; and a gate insulating film formed between the gate electrode and the semiconductive layer, wherein the drain electrode of the drive circuit is connected with the electrode through the via hole of the interlayer insulating film, and wherein the via hole is formed by the hole formation method according to any one of <1> to <6>.

<11> The display element according to <9> or <10>, wherein the light control element contains at least one selected from an electroluminescence element, an electrochromic element, a liquid crystal element, an electrophoretic element, and an electrowetting element.

<12> An image display device including:

two or more of the display element according to any one of <9> to <11> arranged in a matrix form;

two or more wirings for individually applying voltage the display elements; and a display control device which individually controls the voltage applied to the display elements via the wirings based on image data.

<13> A system including:

the image display device according to <12>; and an image data output device which generates image data based on image information to be displayed, and outputs the image data to the image display device.

The hole formation method of the present invention and the multilayer wiring, semiconductor device, display element, image display device and system produced using the hole formation method can be suitably applied as display means for mobile communication apparatuses such as mobile phones, mobile music reproducing devices, mobile motion picture reproducing devices, electronic books, and PDAs (personal digital assistants); and imaging devices such as still cameras and video cameras.

Also, the hole formation method of the present invention and the multilayer wiring, semiconductor device, display element, image display device and system produced using the hole formation method can be suitably applied as display means for various information in mobile objects such as vehicles, aircraft, electric trains and vessels. Further, the image display device can be used as display means for various information in measuring devices, analysis devices, medical instruments and advertizing media.

Notably, the hole formation method of the present invention and the multilayer wiring and semiconductor device produced using the hole formation method can be used as, for example, IC cards and ID tags in addition to the display elements.

The hole formation method of the present invention and the multilayer wiring, semiconductor device, display element, image display device and system produced using the hole formation method can be suitably used as display means for various information in measuring devices, analysis devices, medical instruments and advertizing media.

This application claims priority to Japanese application No. 2011-030992, filed on Feb. 16, 2011, and incorporated herein by reference.

What is claimed is:

1. A hole formation method comprising:
   applying a pillar-forming liquid to a base material, to thereby form a pillar;
   applying an insulating film-forming material to the base material on which the pillar has been formed, to thereby form an insulating film;
   removing the pillar by dissolving with a solution that dissolves the pillar to form an opening in the insulating film; and
   heat treating the insulating film in which the opening has been formed, to deform the opening in the insulating film to a forward tapered shape.

2. The hole formation method according to claim 1, wherein the pillar-forming liquid contains a resin and a solvent.

3. The hole formation method according to claim 1, wherein the applying the pillar-funning liquid is performed by an electrostatic attraction type inkjet method.

4. The hole formation method according to claim 1, wherein the applying the insulating film-forming material is applying the insulating film-forming material to the entire surface of the base material.

5. The hole formation method according to claim 1, wherein the applying the insulating film-forming material is applying the insulating film-forming material on the base material in a line-and-space pattern and making the insulating film-forming material spread over the entire surface of the base material using flowability of the insulating film-forming material.

6. A hole formation method comprising:
   applying a pillar-forming liquid to a base material, to thereby form a pillar;
   applying an insulating film-forming material to the base material on which the pillar has been formed, to thereby form an insulating film;
   removing the pillar to form an opening in the insulating film; and
   heat treating the insulating film in which the opening has been formed,
   wherein the pillar-forming liquid contains inorganic nanoparticles and a solvent.

7. The hole formation method according to claim 6, wherein the applying the pillar-forming liquid is performed by an electrostatic attraction type inkjet method.

8. The hole formation method according to claim 6, wherein the applying the insulating film-forming material is applying the insulating film-forming material to the entire surface of the base material.

9. The hole formation method according to claim 6, wherein the applying the insulating film-forming material is applying the insulating film-forming material on the base material in a line-and-space pattern and making the insulating film-forming material spread over the entire surface of the base material using flowability of the insulating film-forming material.

* * * * *

UNITED STATES PATENT AND TRADEMARK OFFICE
CERTIFICATE OF CORRECTION

| | | |
|---|---|---|
| PATENT NO. | : 8,956,969 B2 | Page 1 of 1 |
| APPLICATION NO. | : 13/372874 | |
| DATED | : February 17, 2015 | |
| INVENTOR(S) | : Yuji Sone et al. | |

It is certified that error appears in the above-identified patent and that said Letters Patent is hereby corrected as shown below:

Replace item (73) on the title page of the patent, with the following:

--(73) Assignees: Ricoh Company, Ltd., Tokyo (JP);
SIJTechnology, Inc., Ibaraki (JP).--

Signed and Sealed this
Fifteenth Day of December, 2015

Michelle K. Lee
*Director of the United States Patent and Trademark Office*